United States Patent
Park et al.

(12)

(10) Patent No.: US 6,400,703 B1
(45) Date of Patent: Jun. 4, 2002

(54) DEVICE AND METHOD FOR GENERATING AND DISTRIBUTING CODED SYMBOLS IN A CDMA COMMUNICATION SYSTEM

(75) Inventors: Chang-Soo Park, Seoul; Jun-Jin Kong, Songnam; Hee-Won Kang, Seoul; Jae-Yoel Kim; Jong-Seon No, both of Kyonggi-do; Kyeong-Cheol Yang, Seoul, all of (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/324,423

(22) Filed: Jun. 1, 1999

(30) Foreign Application Priority Data

May 30, 1998 (KR) .............................................. 98-20141

(51) Int. Cl.[7] .............................................. H04B 7/208
(52) U.S. Cl. ........................ 370/342; 370/320; 370/441
(58) Field of Search ................................ 370/206, 280, 370/320, 342, 262, 479, 203, 441, 422, 335

(56) References Cited

U.S. PATENT DOCUMENTS

| 5,521,937 | A | * | 5/1996 | Kondo et al. ................ 375/206 |
| 5,729,526 | A | * | 3/1998 | Yoshida ....................... 370/206 |
| 5,790,549 | A | * | 8/1998 | Dent .......................... 370/479 |
| 5,864,543 | A | * | 1/1999 | Hoole ......................... 370/280 |
| 6,108,317 | A | * | 8/2000 | Jones et al. .................. 370/320 |
| 6,151,328 | A | * | 11/2000 | Kwon et al. .................. 370/441 |
| 6,178,158 | B1 | * | 1/2001 | Suzuki et al. ................. 370/203 |
| 6,240,287 | B1 | * | 5/2001 | Cheng et al. ................. 455/422 |
| 6,272,183 | B1 | * | 8/2001 | Berens et al. ................ 375/262 |

FOREIGN PATENT DOCUMENTS

| WO | 9963692 | * | 5/1999 | ................ 370/342 |
| WO | 0049780 | * | 8/2000 | ................ 370/342 |

* cited by examiner

Primary Examiner—Salvatore Cangialosi
(74) Attorney, Agent, or Firm—Dilworth & Barrese, LLP

(57) ABSTRACT

A device and method for generating and distributing convolutional codes such that performance degradation due to a bad link environment may be minimized during channel decoding in a CDMA communication system. The convolutional encoder encodes transmission data at a coding rate of R=1/6 and can be used for a channel encoder. Such a channel encoder can be used in both a DS-CDMA communication system and a multicarrier CDMA communication system. When the channel encoder is used in the multicarrier CDMA communication system, the symbols outputted from multiple constituent encoders for the channel encoder are distributed to multiple carrier channels according to a predetermined rule, and the constituent encoders for the channel encoder can minimize the performance degradation of the overall channel encoder even though an output of a particular constituent encoder is completely off at the transmission channel.

15 Claims, 12 Drawing Sheets

DEVICE AND METHOD FOR GENERATING AND DISTRIBUTING CODED SYMBOLS IN A CDMA COMMUNICATION SYSTEM

PRIORITY

This application claims priority to an application entitled "Device and Method for Generating and Distributing Coded Symbols in CDMA Communication System" filed in the Korean Industrial Property Office on May 30, 1998 and assigned Serial No. 98-20141, the contents of which are hereby incorporated by reference.

BACKGROUND OF THE INVENTION

1. Field of the Invention

The present invention relates generally to a CDMA communication system, and in particular, to a device and method for generating and distributing coded symbols capable of preventing degradation in channel performance during data transmission.

2. Description of the Related Art

Code Division Multiple Access (CDMA) communication systems are implemented according to the IS-95 standard. With an increase in the sophistication of CDMA communication technology and a decrease in usage costs, there has been an exponential growth in the number of subscribers of CDMA communication services. Accordingly, many methods have been proposed for meeting subscribers' ever-increasing demands for high quality CDMA service. For example, several methods for improving a forward link structure in the CDMA communication system have been proposed.

One such method for improving the forward link structure, especially a forward link fundamental channel designed for a third generation multicarrier CDMA system, was proposed in the TIA/EIA TR45.5 conference and approved on May 15, 1998 by the Telecommunications Industry Association (TIA). A forward link structure for a multicarrier CDMA communication system is illustrated in FIG. 1.

With reference to FIG. 1, a channel encoder 10 encodes input data, and a rate matcher 20 repeats and punctures symbols outputted from the channel encoder 10. Here, the data input to the channel encoder 10 has a variable bit rate. The rate matcher 20 repeats and punctures the coded data bits (i.e., symbols) outputted from the channel encoder 10 to match symbol rates for the data having the variable bit rate. A channel interleaver 30 interleaves an output of the rate matcher 20. A block interleaver is typically used for the interleaver 30.

A long code generator 91 generates a long code which is identical to that used by the subscriber. The long code is a unique identification code for the subscriber. Thus, different long codes are assigned to the respective subscribers. A decimator 92 decimates the long code to match a rate of the long code to a rate of the symbols outputted from the interleaver 30. An adder 93 adds an output of the channel interleaver 30 and an output of the decimator 92. An exclusive OR gate is typically used for the adder 93.

A demultiplexer 40 sequentially multiplexes data outputted from the adder 93 to multiple carriers A, B and C. First to third binary-to-four level converters 51–53 convert signal levels of binary data outputted from the demultiplexer 40 by converting input data of "0" to "+1" and input data of "1" to "−1". First to third orthogonal modulators 61–63 encode data outputted from the first to third level converts 51–53 with corresponding Walsh codes, respectively. Here, the Walsh codes have a length of 256 bits. First to third spreaders 71–73 spread outputs of the first to third orthogonal modulators 61–63, respectively. Here, QPSK (Quadrature Phase Shift Keying) spreaders can be used for the spreaders 71–73. First to third attenuators (or gain controllers) 81–83 control gains of the spread signals outputted from the first to third spreaders 71–73 according to corresponding attenuation signals GA–GC, respectively. Here, the signals outputted from the first to third attenuators 81–83 become different carriers A, B and C.

In the forward link structure of FIG. 1, the channel encoder 10, having a coding rate of R=1/3, encodes the input data into 3 coded data bits (i.e., code words or symbols) per bit. Such coded data bits are demultiplexed to the three carriers A, B and C after rate matching and channel interleaving. The multicarrier CDMA communication system of FIG. 1 can be modified to a single carrier CDMA communication system by removing the demultiplexer 40 and using only one level converter, one orthogonal modulator, one spreader and one attenuator.

FIG. 2 is a detailed diagram illustrating the channel encoder 10, the rate matcher 20 and the channel interleaver 30. In FIG. 2, data of a first rate is composed of 172 bits (fall rate) per 20 ms frame; data of a second rate is composed of 80 bits (½ rate) per 20 ms frame; data of a third rate is composed of 40 bits (¼ rate) per 20 ms frame; and data of a fourth rate is composed of 16 bits (⅛ rate) per 20 ms frame.

First to fourth CRC generators 111–114 generate CRC bits corresponding to the respective input data having different rates and add the generated CRC bits to the input data. Specifically, 12-bit CRC is added to the 172-bit data of the first rate; 8-bit CRC is added to the 80-bit data of the second rate; 6-bit CRC is added to the 40-bit data of the third rate; and 6-bit CRC is added to the 16-bit data of the fourth rate. First to fourth tail bit generators 121–124 add 8 tail bits to the CRC-added data, respectively. Therefore, the first tail bit generator 121 outputs 192 bits; the second tail bit generator 122 outputs 96 bits; the third tail bit generator 123 outputs 54 bits; and the fourth tail bit generator 124 outputs 30 bits.

First to fourth encoders 11–14 encode data output from the first to fourth tail bit generators 121–124, respectively. A convolutional encoder having a constraint length of K=9 and a coding rate of R=1/3 can be used for the encoders 11–14. In this case, the first encoder 11 encodes the 192-bit data output from the first tail bit generator 121 into 576 symbols of full rate; the second encoder 12 encodes the 96-bit data output from the second tail bit generator 122 into 288 symbols of ½ rate; the third encoder 13 encodes the 54-bit data output from the third tail bit generator 123 into 162 symbols of about ¼ rate; and the fourth encoder 14 encodes the 30-bit data output from the fourth tail bit generator 124 into 90 symbols of about ⅛ rate.

The rate matcher 20 includes repeaters 22–24 and symbol deletion devices 27–28. The repeaters 22–24 repeat symbols outputted from the second to fourth encoders 12–14 according to predetermined times to increase output symbol rates thereof to the fall rate. The symbol deletion devices 27 and 28 delete symbols outputted from the repeaters 23 and 24 which exceed the symbols of the full rate in number. Since the second encoder 12 outputs 288 symbols which is ½ the 576 symbols outputted from the first encoder 11, the second repeater 22 repeats the received 288 symbols two times to output 576 symbols. Further, since the third encoder 13 outputs 162 symbols which is about ¼ the 576 symbols outputted from the first encoder 11 , the third repeater 23 repeats the received 162 symbols four times to output 648 symbols which exceeds the 576 symbols of full rate in number. To match the symbol rate to the full rate, the symbol deletion device 27 deletes every ninth symbol to output 576 symbols of full rate. In addition, since the fourth encoder 14 outputs 90 symbols which is about ⅛ the 576 symbols output from the first encoder 11, the fourth repeater 24 repeats the received 90 symbols eight times to output 720 symbols which exceeds the 576 symbols of full rate in number. To match the symbol rate to the full rate, the symbol deletion device 28 deletes every fifth symbol to output 576 symbols of full rate.

First to fourth channel interleavers 31–34 interleave the symbols of full rate outputted from the first encoder 11, the second repeater 22, the symbol deletion device 27 and the symbol deletion device 28, respectively. Forward Error Correction (FEC) is used to maintain a sufficiently low Bit Error Rate (BER) of a mobile station for a channel having a low signal-to-noise ratio (SNR) by providing a channel coding gain. The forward link for the multicarrier communication system can share the same frequency band with the forward link for the IS-95 system in an overlay method. However, the overlay method provides the following problems.

In the overlay method, three forward link carriers for the multicarrier system are overlaid on three 1.25 MHz bands used in the IS-95 CDMA system. FIG. 3 illustrates transmission power levels, by the respective bands, of base stations for the IS-95 system and the multicarrier system. In the overlay method, since the frequency bands for the multicarrier system are overlaid on the frequency bands for the IS-95 system, the transmission power or channel capacity is shared between the IS-95 base station and the multicarrier base station at the same frequency band. In the case where the transmission power is shared between the two systems, the transmission power is first allocated for the IS-95 channel which mainly supports a voice service and then, the maximum transmission power permissible to the respective carriers for the multicarrier CDMA system is determined. Here, the maximum transmission power cannot exceed a predetermine power level, because the base station has a limited transmission power. Further, when the base station transmits data to many subscribers, interference among the subscribers increases resulting in an increase in noise. FIG. 3 illustrates the state where the IS-95 base station and the multicarrier base station allocate substantially equal transmission power at the respective 1.25 MHz frequency bands.

However, the IS-95 channels of 1.25 MHz frequency bands have a different transmission power according to a change in the number of subscribers in service and a change in voice activity of the subscribers. FIGS. 4 and 5 illustrate situations where the transmission power allocated for the multicarrier base station decreases at some carriers, as the transmission power allocated for the IS-95 base station increases rapidly at the corresponding frequency bands due to an increase in the number of IS-95 subscribers. As a result, sufficient transmission power cannot be allocated for one or more of the multiple carriers so the SNRs are different according to the carriers at the receiver. Accordingly, a signal received at a carrier having the low SNR increases in a bit error rate (BER). That is, when the number of IS-95 subscribers increases and the voice activity is relatively high, a signal transmitted via a carrier overlaid on the corresponding frequency band increases in the BER, resulting in a decreased system capacity and an increased interference among the IS-95 subscribers. That is, the overlay method may cause a reduction in capacity of the multicarrier system and an increase in interference among the IS-95 subscribers.

In the multicarrier system, the respective carriers may have independent transmission powers as illustrated in FIGS. 4 and 5. With respect to performance, FIG. 4 shows the power distribution being similar to the case where a R=1/2 channel encoder is used, and FIG. 5 shows the power distribution being worse than the case where the channel encoder is not used. In these cases, one or two of the three coded bits (i.e., symbols) for an input data bit may not be transmitted, causing a degradation in system performance.

Therefore, even in a direct spreading CDMA communication system using a single carrier, weight distribution of the symbols generated by channel encoding is poor, thereby causing a degradation in channel decoding performance.

SUMMARY OF THE INVENTION

It is, therefore, an object of the present invention to provide a channel encoding device and method capable of generating coded data exhibiting a good channel coding performance in a CDMA communication system.

It is another object of the present invention to provide a channel encoding device and method capable of generating channel coded data having a good channel coding performance and effectively distributing the generated channel-coded data to respective carriers in a multicarrier CDMA communication system.

It is further another object of the present invention to provide a channel transmission device and method for distributing generated symbols to carriers such that system degradation caused by symbols damaged during transmission is minimized in a multicarrier CDMA communication system.

It is still another object of the present invention to provide an R=1/6 convolutional encoding device and method capable of increasing channel performance of a channel transmitter in a CDMA communication system.

To achieve the above objects, there is provided a communication system using at least two carriers. The communication system includes a channel encoder for encoding data, a channel controller for generating a control signal for transmitting channel coded symbols for performing decoding using data received via at least one carrier, and a symbol distributer for assigning the channel coded symbols to at least two carriers.

Also, there is provided a channel encoding device having a plurality of delays for delaying an input data bit to generate first to eight delayed data bits; a first operator for exclusively Oring the input data bit and the third, fifth, sixth, seventh and eighth delayed data bits to generate a first sysmbol; a second operator for exclusively Oring the input data bit and the first, second, third, fifth, sixth and eighth delayed data bits to generate a second symbol; a third operator for exclusively Oring the input data bit and the second, third, fifth and eighth delayed data bits to generate a third symbol; a fourth operator for exclusively Oring the input data bit and the first, fourth, fifth, sixth, seventh and eighth delayed data bits to generate a fourth symbol; a fifth operator for exclusively Oring the input data bit and the first, fourth, sixth and eighth delayed data bitss to generate a fifth symbol; and a sixth operator for exclusively Oring the input data bit and the first, second, fourth, sixth, seventh and eighth delayed data bits to generate a sixth symbol.

BRIEF DESCRIPTION OF THE DRAWINGS

The above and other objects, features and advantages of the present invention will become more apparent from the following detailed description when taken in conjunction with the accompanying drawings, in which.

DETAILED DESCRIPTION OF THE PREFERRED EMBODIMENTS

A preferred embodiment of the present invention will be described herein below with reference to the accompanying drawings. In the following description, well known functions or constructions are not described in detail since they would obscure the invention in unnecessary detail.

The word "symbol" as used herein refers to a coded data bit outputted from an encoder. For convenience of explanation, it is assumed that the multicarrier communication system is a three-carrier CDMA communication system. It is contemplated that the present invention can be embodied in other types of communication systems, such as Time Division Multiple Access (TDMA).

**NOTE: The following descriptions are under review. The completed specification and claims will be forwarded by tomorrow.

The present invention provides a device and method for improving system performance in a communication system supporting both the IS-95 system and the multicarrier system, wherein transmission signals of the two different systems are overlaid at the same frequence bands. In the present device and method, the coded symbols are distributed such that performance degradation is minimized during decoding of the damaged symbols, and then the distributed coded bits are assigned to the respective carriers. Thus, even if one of the carriers has interference during reception, it is possible to perform decoding for only the coded bits transmitted via the other carriers, thereby improving system performance.

Moreover, in the forward link, an R=1/6 convolutional code can be used for a channel encoder. Therefore, when the channel encoder generates R=1/6 convolutional codes, it is very difficult to find R=1/6 convolutional codes having a good decoding performance. Accordingly, the present invention is directed to generating R=1/6 convolutional codes with a good decoding performance and distributing the generated convolutional codes to multiple carriers. The R=1/6 convolutional codes generated according to the present invention exhibit good performance in both a multicarrier CDMA communication system and a DS-CDMA communication system.

A description will now be given as to a method of generating symbols for maximizing channel performance and distributing the generated symbols in a CDMA communication system according to an embodiment of the present invention. For convenience, the present invention is described herein below with reference to a multicarrier CDMA communication system.

Figure 1:
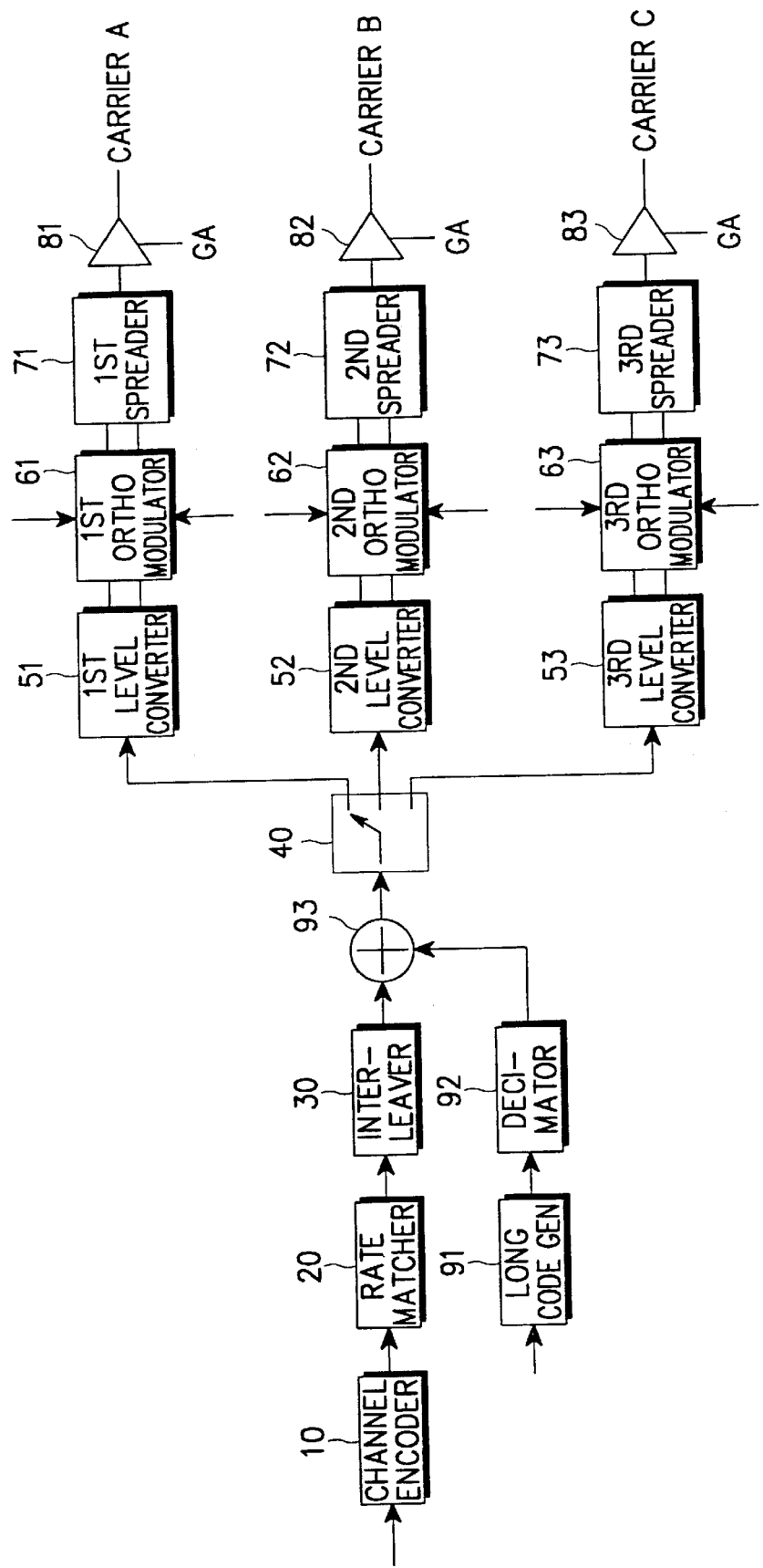
FIG. 1 is a block diagram of a forward link structure for a conventional multicarrier CDMA communication system.
Figure 2:
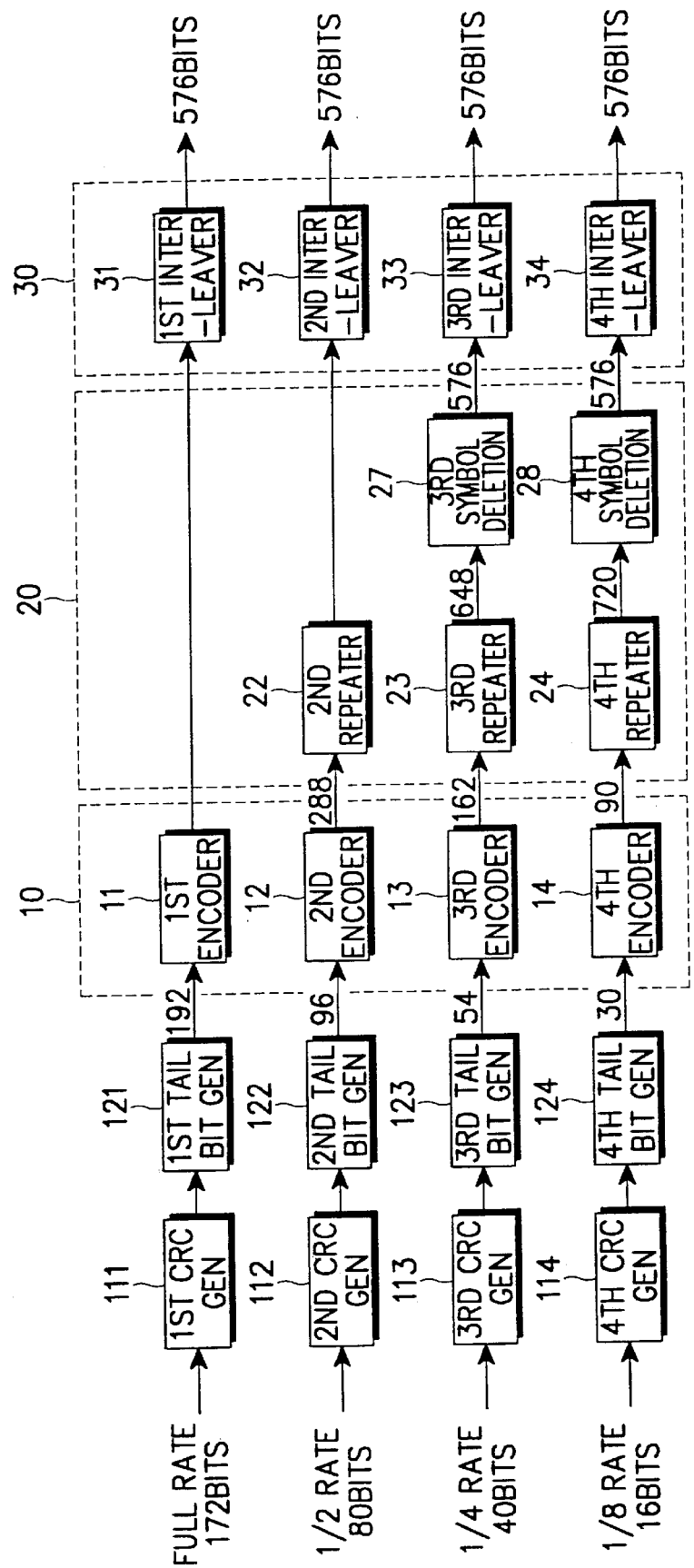
FIG. 2 is a block diagram illustrating a fundamental channel structure for the forward link structure of FIG. 1.
Figure 3:
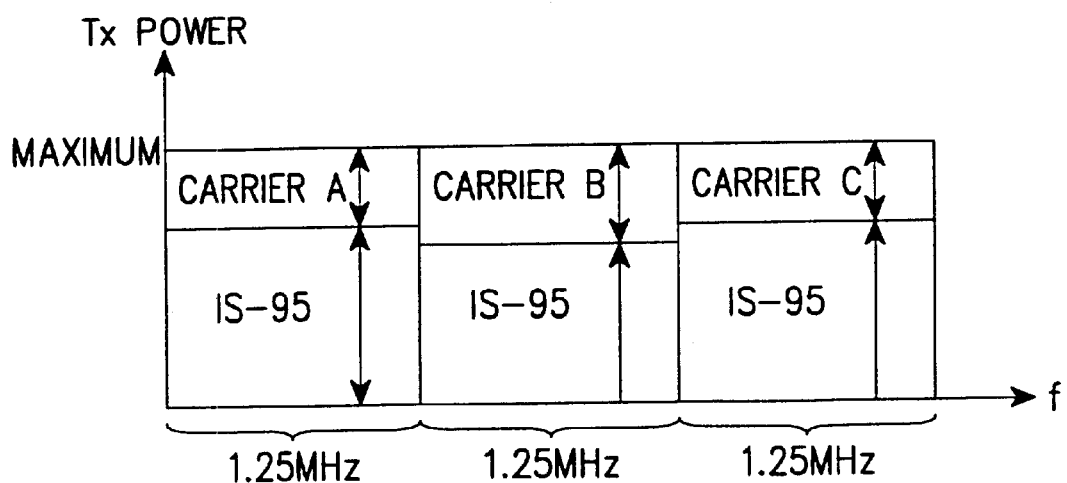
FIG. 3 is a diagram illustrating transmission power distribution of IS-95 channel bands and multicarrier channel bands where the multicarrier channel bands are overlaid on the IS-95 channel bands at the same frequency bands in the CDMA system of FIG. 1.
Figure 4:
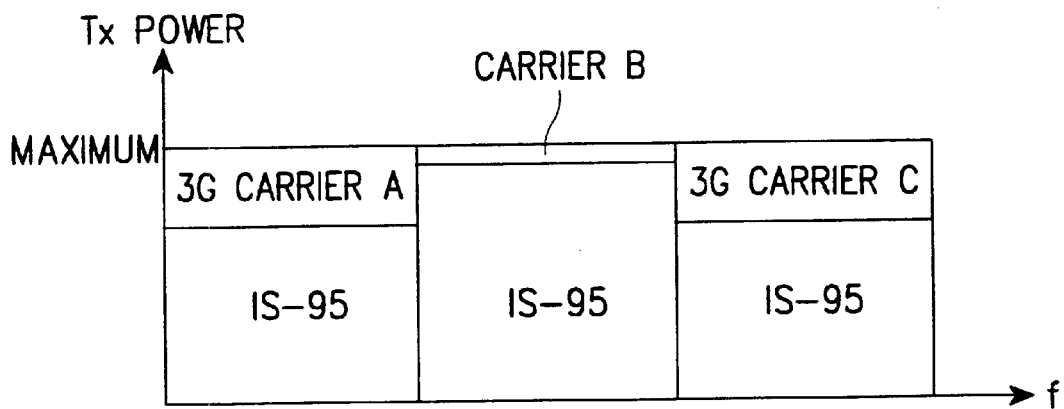
FIG. 4 is a diagram illustrating a state where the transmission power of one multiple carrier is decreased when a transmission power for a corresponding IS-95 channel is increased, due to a limitation in transmission power or transmission capacity in the CDMA system of FIG. 1.
Figure 5:
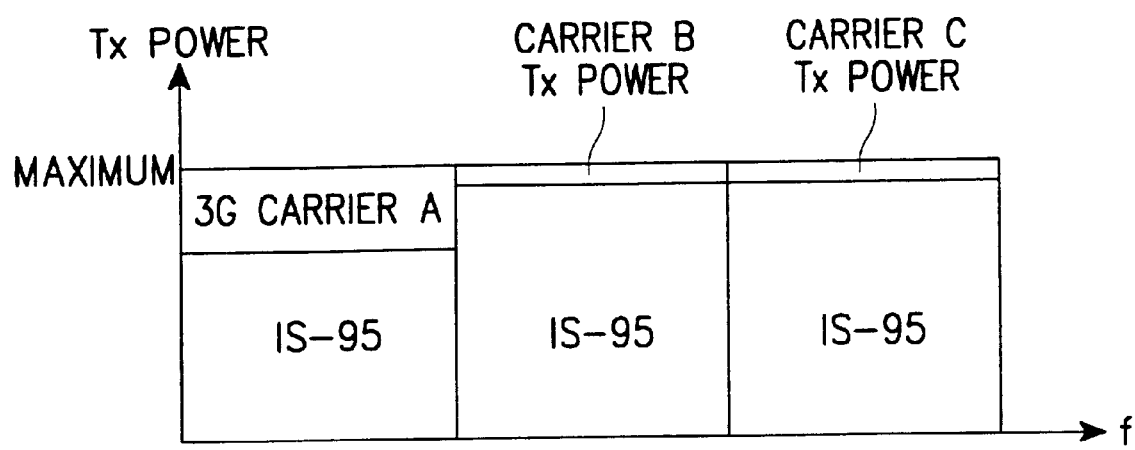
FIG. 5 is a diagram illustrating a state where the transmission power of two multiple carriers decreases when transmission power for corresponding IS-95 channels are increased, due to a limitation in transmission power or transmission capacity in the CDMA system of FIG. 1.
Figure 6:
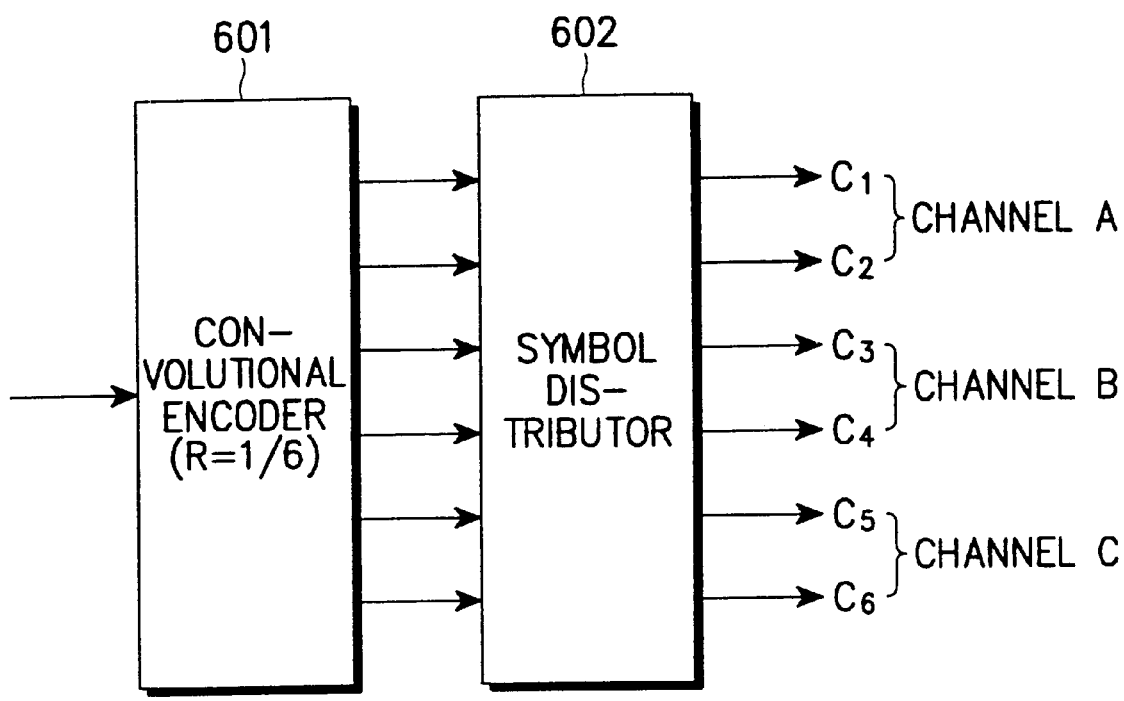
FIG. 6 is a block diagram of a channel encoder and a symbol distributer for generating R=1/6 convolutional codes according to an embodiment of the present invention.

First, reference will be made to R=1/6 convolutional codes for a multicarrier CDMA communication system using three carriers. FIG. 6 illustrates a convolutional encoder 601 and a symbol distributer 602 according to an embodiment of the present invention. The convolutional encoder 601 encodes one input data bit into six symbols which are allocated to three carriers A, B and C. For symbol allocation, the symbol distributer 602 uniformly distributes the six input bits to the three carriers by two bits. The symbol distributer 602 distributes the symbols outputted from the convolutional encoder 601, taking into consideration how many carriers are damaged out of the three carriers. By using this symbol distribution method, even though one or two of the three carriers are damaged, performance degradation in channel decoding is minimized.

A description will now be made as to a method for designing the symbol distributer 602. A bit error rate (BER) value after channel decoding depends primarily on the number of damaged portions of the symbols which were coded by a channel encoder. Even though the coded symbols are damaged, the symbols located at portions which are least likely to degrade system performance are uniformly distributed to the carriers. Accordingly, even though the symbols for a certain channel are all damaged, an increase in the BER value can be minimized after channel decoding by distributing the non-damaged symbols (or the damaged symbols which are the least likely to degrade system performance) to the carriers.

In addition, during transmission, the symbols outputted from a constituent encoder in the channel encoder are distributed to the carriers; during decoding, a constituent decoder in a channel decoder is selected such that the BER can be low, even though the symbols for a certain carrier are all damaged.

Selection of the constituent decoder in the channel decoder will now be described. First, reference will be made to a convolutional cod having a constraint length of K=9 and a rate of R=1/3. In the following description, generator polynomials $g_i$ are represented by an octal number. The convolutional code with K=9 and R=1/3 has a free distance of $d_{free}$=18. It is noted that there exist 5685 sets when a search is made for convolutional codes having K=9, R=1/3 and $d_{free}$=18, by changing generator polynomials $g_1$, $g_2$, and $g_3$. Only non-catastrophic codes are selected. In addition, it is necessary to prevent performance degradation, even though a certain carrier is damaged, when selecting convolutional codes to be provided to the multicarrier system. Accordingly, it is preferable to maximize the free distance value.

In selecting a reference code for performance comparison, a convolutional code of $(g_1, g_2, g_3)$=(557, 663, 711) is selected and used; this is the same code used in the IS-95 system. In the IS-95 system, a free distance of the convolutional code is $d_{free}$=18, and free distances between constituent codes are $d_{free}(g_{557},g_{663})$=9, $d_{free}(g_{557},g_{711})$=11, and $d_{free}(g_{663},g_{711})$=10. Further, a performance of a convolutional code can be predicted using a BER upper limit formula, which is determined by a transfer function. For the IS-95 system, a transfer function of a convolutional code is $T(D,I)|_{I=1}$=$5D^{18}+7D^{20}+O(D^{21})$, and a BER upper limit formula is $(\partial/\partial I)T(D,I)|_{I=1}$$11D^{18}+32D^{20}+O(D^{21})$.

When the convolutional code for the IS-95 system is viewed in light of a constituent code, a catastrophic error propagation occurs at a combination of generator polynomials $g_1$ and $g_2$. Therefore, when the convolutional codes for the IS-95 system are used for the multicarrier system, it is necessary to appropriately use interleaving and puncturing. Since the IS-95 convolutional codes cause catastrophic error propagation, it is necessary to search for new convolutional codes suitable for the multicarrier system. For K=9, $d_{free}(g_i, g_j)\leq 12$, it is found from a complete computer search that there is no convolutional code for which a free distance between constituent codes is always 12. Therefore, there are only eight convolutional codes having the free distance of $d_{free}(g_i,g_j)\geq 11$. Here, not only the convolutional codes, but also the constituent codes are non-catastrophic. Since a first term of the BER upper limit formula is most influential, first and eighth convolutional codes are considered to be the most optimal codes. Further, since the pairs of first and eighth convolutional codes; second and seventh codes; third and fourth codes; and fifth and sixth codes are in reciprocal relation, they are essentially the same codes. Therefore, only four convolutional codes exist.

Table 1 provides characteristics of a convolutional encoder with K=9 and R=1/3.

TABLE 1

| No | | Generator Polynomial | Remarks |
|---|---|---|---|
| 1 | 467 | Free Distance between Constituent Codes | $d_{12}$=11, $d_{13}$=11, $d_{23}$=12 |
| | 543 | Transfer Function, $T(D,I)|_{I=1}$ | $4D^{18}+12D^{20}+O(D^{21})$ |
| | 765 | BER Upper Limit Formula | $9D^{18}+54D^{20}+O(D^{21})$ |
| 2 | 547 | Free Distance between Constituent Codes | $d_{12}$=11, $d_{13}$=11,$(d_{23}$=12 |
| | 643 | Transfer Function, $T(D,I)|_{I=1}$ | $6D^{18}+9D^{20}+O(D^{21})$ |
| | 765 | BER Upper Limit Formula | $19D^{18}+33D^{20}+O(D^{21})$ |
| 3 | 453 | Free Distance between Constituent Codes | $d_{12}$=11, $d_{13}$=12, $d_{23}$=11 |
| | 665 | Transfer Function, $T(D,I)|_{I=1}$ | $5D^{18}+7D^{20}+O(D^{21})$ |
| | 771 | BER Upper Limit Formula | $13D^{18}+31D^{20}+O(D^{21})$ |
| 4 | 477 | Free Distance between Constituent Codes | $d_{12}$=11, $d_{13}$=12, $d_{23}$=11 |
| | 533 | Transfer Function, $T(D,I)|_{I=1}$ | $5D^{18}+7D^{20}+O(D^{21})$ |
| | 651 | BER Upper Limit Formula | $13D^{18}+31D^{20}+O(D^{21})$ |
| 5 | 561 | Free Distance between Constituent Codes | $d_{12}$=11, $d_{13}$=12, $d_{23}$11 |
| | 647 | Transfer Function, $T(D,I)|_{I=1}$ | $5D^{18}+7D^{20}+O(D^{21})$ |
| | 753 | BER Upper Limit Formula | $13D^{18}+31D^{20}+O(D^{21})$ |
| 6 | 435 | Free Distance between Constituent Codes | $d_{12}$=12, $d_{13}$=11, $d_{23}$=11 |
| | 657 | Transfer Function, $T(D,I)|_{I=1}$ | $5D^{18}+7D^{20}+O(D^{21})$ |
| | 713 | BER Upper Limit Formula | $13D^{18}+31D^{20}+O(D^{21})$ |
| 7 | 537 | Free Distance between Constituent Codes | $d_{12}$=12, $d_{13}$=11, $d_{23}$=11 |
| | 613 | Transfer Function, $T(D,I)|_{I=1}$ | $6D^{18}+9D^{20}+O(D^{21})$ |
| | 715 | BER Upper Limit Formula | $19D^{18}+33D^{20}+O(D^{21})$ |
| 8 | 537 | Free Distance between Constituent Codes | $d_{12}$=12, $d_{13}$=11, $d_{23}$=11 |
| | 615 | Transfer Function, $T(D,I)|_{I=1}$ | $4D^{18}+12D^{20}+O(D^{21})$ |
| | 731 | BER Upper Limit Formula | $9D^{18}+54D^{20}+O(D^{21})$ |

In Table 1, $d_{12}$ in a first term means $d_{(467,543)}$ and hereinafter is used to provide the same meaning. For information, when the codes are compared with the IS-95 codes in light of the first term of the BER upper limit formula, the first and eighth codes are superior in performance to the IS-95 codes, the third, fourth, fifth and sixth codes are similar in performance to the IS-95 codes and the second and seventh codes are inferior in performance to the IS-95 codes. Therefore, it is preferable to use the eighth (or first) code.

Figure 10:
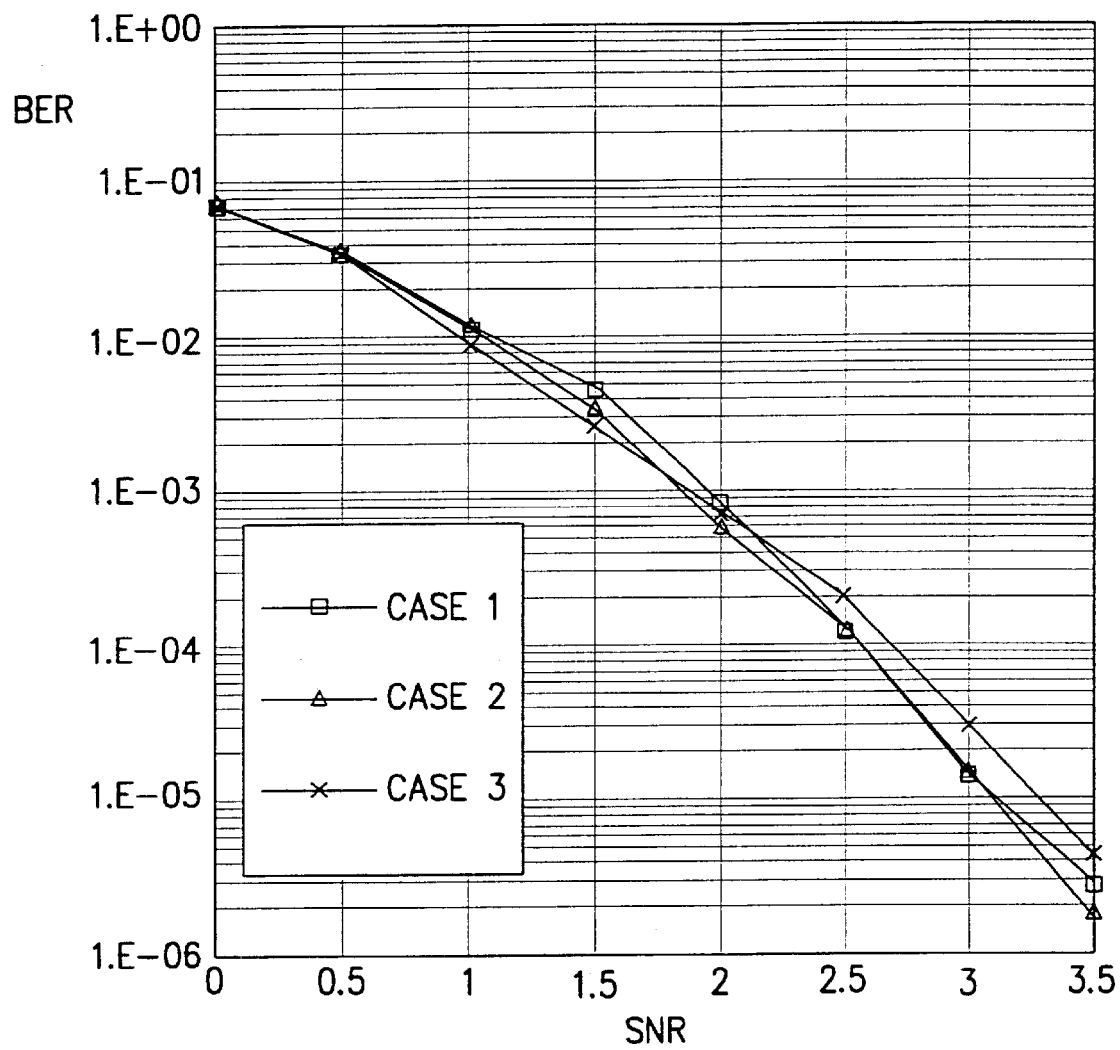
FIG. 10 is a chart providing a performance comparison among R=1/3 convolutional codes.
Figure 11:
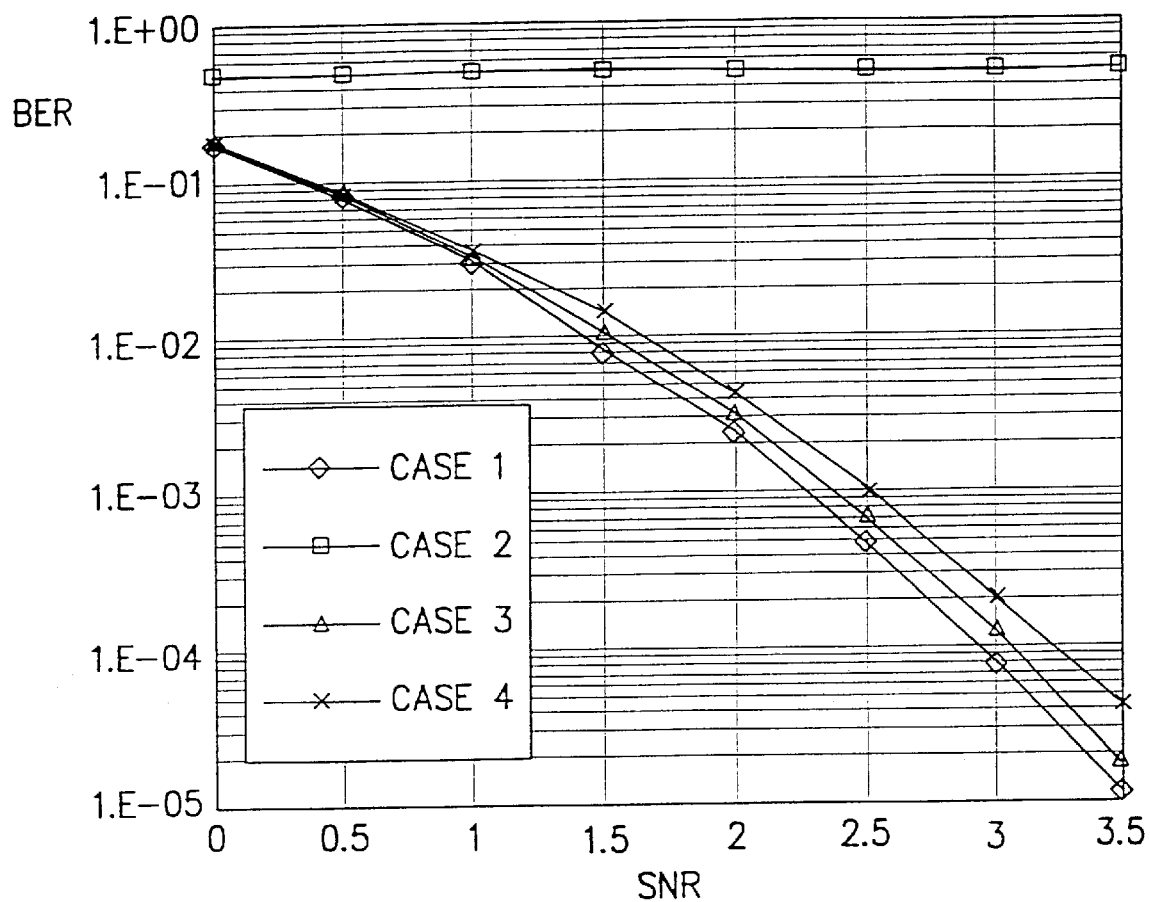
FIG. 11 is a chart illustrating a worst performance comparison among R=1/2 convolutional codes using generator polynomials of a convolutional encoder having a coding rate of R=1/3.
Figure 12:
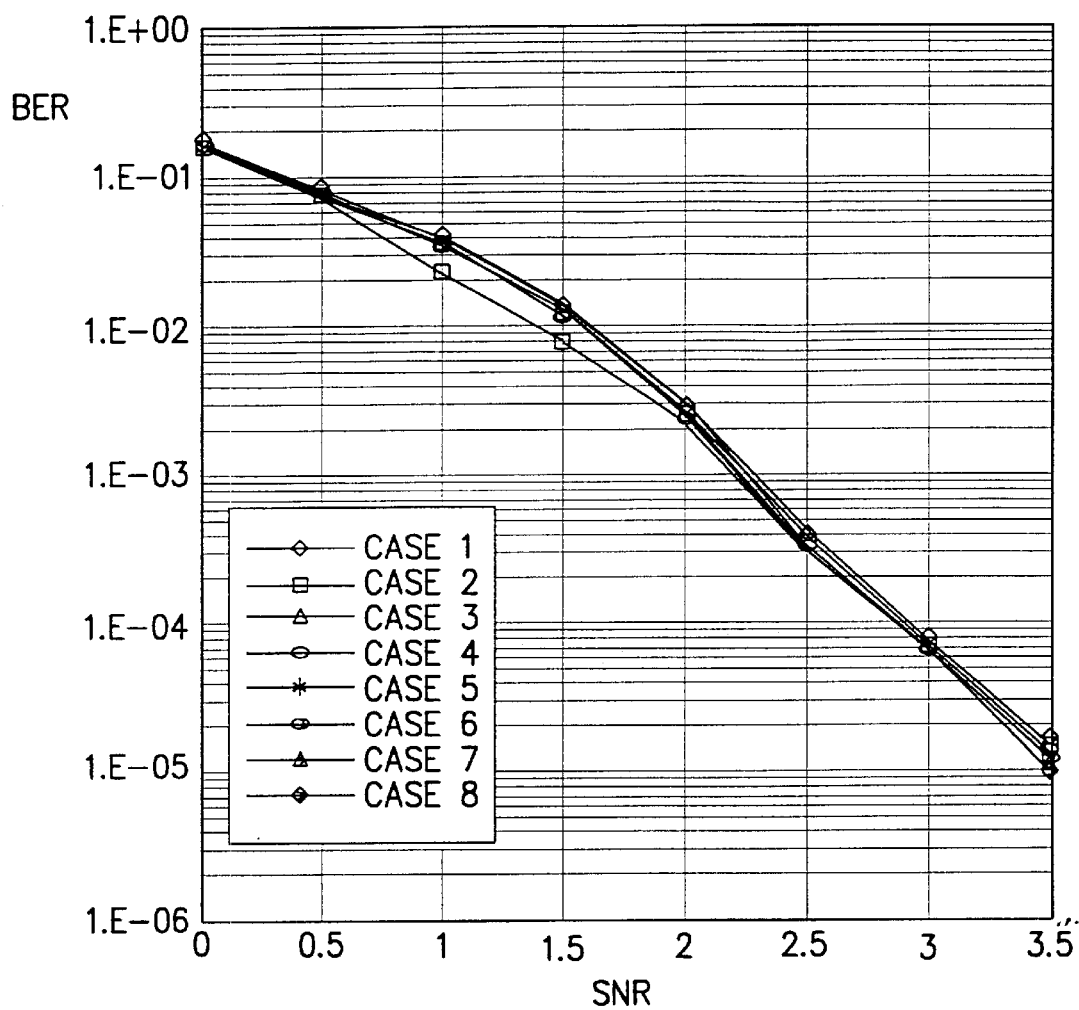
FIG. 12 is a chart illustrating a performance comparison among R=1/2 constraint codes for an R=1/6 convolutional code.
Figure 13:
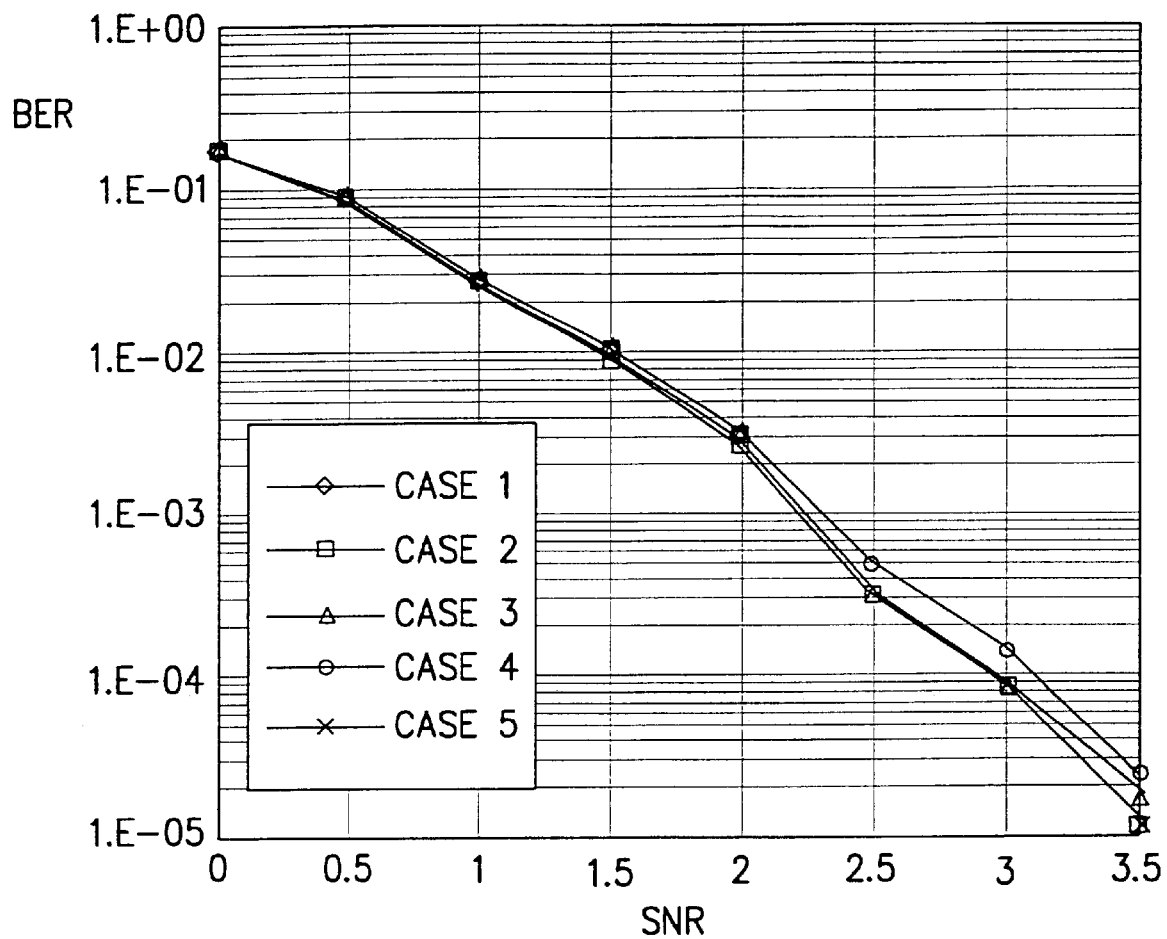
FIG. 13 is a chart illustrating a worst performance comparison among R=1/2 constraint codes using an R=1/6 convolutional encoder having a good performance.

In the meantime, there exist four or more codes whose free distances among the constituent codes are 12, 12 and 10; among these codes, a generator polynomial for a superior code in the light of the first term of the BER upper limit formula is $(g_1,g_2,g_3)$=(515, 567, 677). Shown in FIG. 10 is the simulation result for performances of the convolutional code with R=1/3 in a AWGN (Additive White Gaussian Noise) environment in the case where the multicarrier (three-carrier) system has an optimal performance without damage of the respective carriers. In the following descriptions, the simulations of FIGS. 11–13 are all performed in the AWGN environment. <Case 1> represents a R=1/3 convolutional code for an IS-95 system, and <Case 2> and <Case 3> represent a R=1/3 convolutional code searched for using the inventive method.

<Case 1> IS-95 ($g_1$=557, $g_2$=663, $g_3$=711)→$d_{free}$=18

<Case 2> $g_1$=731, $g_2$=615, $g_3$=537→$d_{free}$=18 $d_{free}(g_1,g_2)$=11, $d_{free}(g_1,g_3)$=11, $d_{free}(g_2,g_3)$=12

<Case 3> $g_1$=515, $g_2$=567, $g_3$=677→$d_{free}$=18 $d_{free}(g_1,g_2)$=11, $d_{free}(g_1,g_3)$=12, $d_{free}(g_2,g_3)$=10

A description will now be made regarding the case where the R=1/3 convolutional code is applied to the three-carrier system and a certain one of the three carriers is damaged (or lost). Although the original coding rate is 1/3, the loss of one carrier causes the coding rate to be equal to 1/2. Therefore, shown in FIG. 11 is the simulation results for the 1/2 convolutional codes using the generator polynomials for the 1/3 convolutional codes. In FIG. 11, the respective conditions can be explained by <Case 1> through <Case 4>. FIG. 11 illustrates the worst performance graph for the R=1/2 convolutional codes using the generator polynomials for the R=1/3 convolutional code.

<Case 1> Optimal 1/2 convolutional code→$g_1$=561, $g_2$=753, $d_{free}(g_1,g_2)$=12

<Case 2> the worst performance, $g_1$=557, $g_2$=711 out of three R=1/2 convolutional codes using the generator polynomial (557, 663, 711) for a 1/3 convolutional code used for the IS-95 system→catastrophic error propagation occurs <Case 3> the worst performance, $g_1$=731, $g_2$=615 ($d_{fre}(g_1,g_2)$=11) for R=1/2 convolutional code using the generator polynomial (731, 615, 537) for a R=1/3 convolutional code <Case 4> the worst performance, $g_1$=567, $g_2$=677 ($d_{fre}(g_1,g_2)$=10) for R=1/2 convolutional code using the generator polynomial (515, 567, 677) for a R=1/3 convolutional code When one carrier is damaged in a three-carrier system using an R=1/3 convolutional code, the coding rate becomes equal to R=1/2. In this case, a symbol distribution method for the symbol distributer is found by appropriately distributing the original R=1/3 convolutional codes to the three carriers using the symbol deleting matrixes shown below to minimize performance degradation even though the coding rate becomes R=1/2. In the simplest method, the two symbol deleting matrixes shown below are generated. In the symbol deleting matrixes, "0" means the case where a carrier to which the corresponding symbol is provided is damaged, and "1" means the case where the carrier to which the corresponding symbol is provided is not damaged. This means that the symbols corresponding to "0" are all allocated to a certain carrier which is damaged during transmission. Therefore, one of the following various patterns of the symbol deleting matrix is selected which minimizes performance degradation even though one carrier is damaged, and the symbol distributer 602 provides the symbols to the respective carriers using the selected pattern. The following symbol deleting matrixes are used for finding a pattern to be used by the symbol distributer 602 to correctly allocate the symbols to the respective carriers.

$$D_1 = \begin{bmatrix} 0 & 1 & 1 \\ 1 & 0 & 1 \\ 1 & 1 & 0 \end{bmatrix}$$

$$D_2 = \begin{bmatrix} 1 & 1 & 0 \\ 1 & 0 & 1 \\ 0 & 1 & 1 \end{bmatrix}$$

Further, an m-sequence having an 8-bit length is generated over a two-stage GF(3) using an m-sequence. For a ninth convolutional code, a sequence {1,2,0,2,2,1,0,1,2} is generated and then, the following symbol deleting matrix $D_3$ is generated using the sequence.

$$D_3 = \begin{bmatrix} 1 & 1 & 0 & 1 & 1 & 1 & 0 & 1 & 1 \\ 0 & 1 & 1 & 1 & 1 & 0 & 1 & 0 & 1 \\ 1 & 0 & 1 & 0 & 0 & 1 & 1 & 1 & 0 \end{bmatrix}$$

Further, the following symbol deleting matrixes $D_4$ and $D_5$ are generated by changing the rows of the symbol deleting matrix $D_3$.

$$D_4 = \begin{bmatrix} 1 & 0 & 1 & 0 & 0 & 1 & 1 & 1 & 0 \\ 1 & 1 & 0 & 1 & 1 & 1 & 0 & 1 & 1 \\ 0 & 1 & 1 & 1 & 1 & 0 & 1 & 0 & 1 \end{bmatrix}$$

$$D_5 = \begin{bmatrix} 0 & 1 & 1 & 1 & 1 & 0 & 1 & 0 & 1 \\ 1 & 0 & 1 & 0 & 0 & 1 & 1 & 1 & 0 \\ 1 & 1 & 0 & 1 & 1 & 1 & 0 & 1 & 1 \end{bmatrix}$$

In addition, a sequence {2,1,0,1,1,0,1,2,1,0,0,0,2,1,2} is obtained by generating 15 random numbers over GF(3) using a random number, and the following symbol deleting matrix $D_6$ using the above sequence.

$$D_6 = \begin{bmatrix} 1 & 1 & 0 & 1 & 1 & 0 & 1 & 1 & 1 & 0 & 0 & 0 & 1 & 1 & 1 \\ 1 & 0 & 1 & 0 & 0 & 1 & 0 & 1 & 0 & 1 & 1 & 1 & 1 & 0 & 1 \\ 0 & 1 & 1 & 1 & 1 & 1 & 1 & 0 & 1 & 1 & 1 & 1 & 0 & 1 & 0 \end{bmatrix}$$

Also, the following symbol deleting matrixes $D_7$ and $D_8$ are generated by changing the rows as in the method using the m-sequence.

$$D_7 = \begin{bmatrix} 0 & 1 & 1 & 1 & 1 & 1 & 1 & 0 & 1 & 1 & 1 & 1 & 0 & 1 & 0 \\ 1 & 1 & 0 & 1 & 1 & 0 & 1 & 1 & 1 & 0 & 0 & 0 & 1 & 1 & 1 \\ 1 & 0 & 1 & 0 & 0 & 1 & 0 & 1 & 0 & 1 & 1 & 1 & 1 & 0 & 1 \end{bmatrix}$$

$$D_8 = \begin{bmatrix} 1 & 0 & 1 & 0 & 0 & 1 & 0 & 1 & 0 & 1 & 1 & 1 & 1 & 0 & 1 \\ 0 & 1 & 1 & 1 & 1 & 1 & 1 & 0 & 1 & 1 & 1 & 1 & 0 & 1 & 0 \\ 1 & 1 & 0 & 1 & 1 & 0 & 1 & 1 & 1 & 0 & 0 & 0 & 1 & 1 & 1 \end{bmatrix}$$

Next, a description will be made regarding a convolutional code having a symbol rate of 1/6. A K=9, R=1/6 convolutional code has a free distance of $d_{free}$=37. In searching for the convolutional codes having a free distance of $d_{free}$=37 by randomly changing the generator polynomials $g_1, g_2, \ldots g_6$, the following conditions should be satisfied.

First, it should be a R=1/6 convolutional code with a good decoding performance.

Second, it should be a R=1/4 convolutional code with a good decoding performance which has polynomials ($g_1,g_2,g_3,g_4$), ($g_1,g_2,g_5,g_6$) and ($g_3,g_4,g_5,g_6$), considering the case that one of three carriers is damaged in the three-carrier system.

Third, it should be a 1/2 convolutional code with a good decoding performance which has generator polynomials ($g_1,g_2$), ($g_3,g_4$) and ($g_5,g_6$), considering the case that two of three carriers are damaged in the three-carrier system.

With respect to the second and third conditions, performance degradation is minimized even though one or two of the three carriers are completely off, providing for the multicarrier system in which six output bits of the convolutional code are allocated to three carriers by two bits. From this point of view, it is preferable that the R=1/4 convolutional code and the R=1/2 convolutional code have the maximum free distance.

A method of searching for a R=1/2 convolutional code satisfying the third condition becomes apparent from the following description. There exist 35 non-catastrophic convolutional codes with R=1/2, K=9 and $d_{free}$=12. An upper limit formula for the BER is given as follows (a coefficient $c_{12}$ of the most important term $D^{12}$ in determining the BER ranges from 33 to 123):

$$(\partial/\partial I)T(D,I)|_{I=1}=c_{12}D^{12}+c_{13}D^{13}+\ldots$$

First, for the R=1/6 convolutional codes, there exist 180 R=1/6 convolutional codes with $d_{free}$=37, satisfying the third condition. It is assumed that $d_{free}(g_{2i-1},g_{2i})$=12. Here, there exist 58 convolutional codes in which the first term of the BER upper limit formula for the R=1/6 convolutional code has a coefficient of $c_{37}$=1. The following are the R=1/6 convolutional codes selected among the 58 convolutional codes after conducting a performance verification or analysis.

1) (457, 755, 551, 637, 523, 727): $c_{38}$=4 (NO=1)
2) (457, 755, 551, 637, 625, 727): $c_{38}$=4 (NO=3)
3) (457, 755, 455, 763, 625, 727): $c_{38}$=4 (NO=5)
4) (515, 677, 453, 755, 551, 717): $c_{38}$=6 (NO=7)
5) (515, 677, 453, 755, 551, 717): $c_{38}$=6 (NO=9)
6) (515, 677, 557, 651, 455, 747): $c_{38}$=6 (NO=11)
7) (457, 755, 465, 753, 551, 637): $c_{38}$=6 (NO=13)
8) (515, 677, 551, 717, 531, 657): $c_{38}$=8 (NO=27)
9) (515, 677, 455, 747, 531, 657): $c_{38}$=8 (NO=29)
10) (453, 755, 557, 751, 455, 747): $c_{38}$=10 (NO=31)
11) (545, 773, 557, 651, 551, 717): $c_{38}$=12 (NO=51)
12) (453, 755, 457, 755, 455, 747): $c_{38}$=20 (NO=57)

The following are 5 R=1/6 convolutional codes with a good decoding performance selected among the 12 performance-verified 1/6 convolutional codes listed above.

1) (457, 755, 551, 637, 523, 727): $c_{38}$=4 (NO=1)
2) (515, 677, 453, 755, 551, 717): $c_{38}$=6 (NO=7)
3) (545, 773, 557, 651, 455, 747): $c_{38}$=6 (NO=8)
4) (515, 677, 557, 651, 455, 747): $c_{38}$=6 (NO=11)
5) (515, 677, 455, 747, 531, 657): $c_{38}$=8 (NO=29)

A performance of the R=1/2 convolutional codes using five generator polynomials for the R=1/6 convolutional code are verified, and further, a performance of the R=1/4 convolutional codes using five generator polynomials for the R=1/6 convolutional code are also verified. First, a transfer function for the R=1/2 convolutional codes will be described with reference to Table 2 in which the generator polynomials are represented by octal numbers.

TABLE 2

| No | 1/2 Generator Polynomial | BER Upper Limit Formula, Coeff $c_{12}$, $c_{13}$, $c_{14}$ |
|---|---|---|
| 1 | 435, 657 | (33, 0, 281) |
| 2 | 561, 753 | (33, 0, 281) |
| 3 | 515, 677 | (38, 106, 238) |
| 4 | 545, 773 | (38, 106, 238) |
| 5 | 463, 755 | (38, 0, 274) |
| 6 | 557, 631 | (38, 0, 274) |
| 7 | 557, 751 | (40, 33, 196) |
| 8 | 457, 755 | (40, 33, 196) |
| 9 | 453, 755 | (40, 0, 271) |
| 10 | 557, 651 | (40, 0, 271) |
| 11 | 471, 673 | (50, 0, 298) |
| 12 | 537, 615 | (50, 0, 360) |
| 13 | 543, 765 | (50, 0, 360) |
| 14 | 455, 747 | (50, 0, 395) |
| 15 | 551, 717 | (50, 0, 395) |
| 16 | 465, 753 | (52, 0, 287) |
| 17 | 531, 657 | (52, 0, 287) |
| 18 | 455, 763 | (52, 0, 339) |
| 19 | 551, 637 | (52, 0, 339) |
| 20 | 561, 735 | (57, 0, 355) |
| 21 | 435, 567 | (57, 0, 355) |
| 22 | 561, 755 | (57, 0, 390) |
| 23 | 435, 557 | (57, 0, 390) |
| 24 | 465, 771 | (58, 0, 321) |
| 25 | 477, 531 | (58, 0, 321) |
| 26 | 537, 613 | (67, 0, 472) |
| 27 | 643, 765 | (67, 0, 472) |
| 28 | 523, 727 | (68, 0, 349) |
| 29 | 625, 727 | (68, 0, 349) |
| 30 | 523, 755 | (68, 0, 363) |
| 31 | 557, 625 | (68, 0, 363) |
| 32 | 453, 771 | (70, 0, 496) |
| 33 | 477, 651 | (70, 0, 496) |
| 34 | 515, 567 | (123, 0, 589) |
| 35 | 545, 735 | (123, 0, 589) |

A R=1/2 convolutional code with the highest performance is searched by verifying the performance of the respective R=1/2 convolutional codes in Table 2. In addition, the performance of each of the R=1/2 convolutional codes is compared with the performance of the optimal R=1/2 convolutional code used by the IS-95 system.

<Case 1> generator polynomial→$(435, 657)_8$, NO=1, $c_{12}$=33

<case 2> generator polynomial→$(561, 753)_8$, NO=2, $c_{12}$=33, an optimal R=1/2 convolutional code used for the IS-95 standard <Case 3> generator polynomial→$(557, 751)_8$, NO=7, $c_{12}$=40

<Case 4> generator polynomial→$(453, 755)_8$, NO=9, $c_{12}$=40

<Case 5> generator polynomial→$(471, 673)_8$, NO=11, $c_{12}$=50

<Case 6> generator polynomial→$(531, 657)_8$, NO=17, $c_{12}$=52

<Case 7> generator polynomial→$(561, 755)_8$, NO=22, $c_{12}$=57

<Case 8> generator polynomial→$(465, 771)_8$, NO=24, $c_{12}$=58

A performance comparison among the respective cases is shown in FIG. 12. FIG. 12 illustrates a performance comparison among R=1/2 constituent codes for the R=1/6 convolutional code. It is noted that the R=1/2 constituent codes for the R=1/6 convolutional code are similar in performance to the optimal R=1/2 convolutional code.

Table 3 illustrates transfer functions for the R=1/6 convolutional codes.

TABLE 3

| No | 1/6 Generator Polynomial (Octal Number) | 1/6 BER coeff. $c_{37}, c_{38}, c_{39}$ | 1/2 BER coeff. $c_{12}$ (1,2; 3,4; 5,6) | 1/4 BER coeff. $c_{24}$ (1234; 1256; 3456) |
|---|---|---|---|---|
| 1 | 457 755 551 637 523 727 | (1, 4, 9) | (40, 52, 68) | (8, 2, 5) |
| 2 | 557 751 455 763 625 727 | (1, 4, 9) | (40, 52, 68) | (8, 2, 5) |
| 3 | 457 755 551 637 625 727 | (1, 4, 9) | (40, 52, 68) | (8, 6, 5) |
| 4 | 557 751 455 763 523 727 | (1, 4, 9) | (40, 52, 68) | (8, 6, 5) |
| 5 | 457 755 455 763 625 727 | (1, 4, 9) | (40, 52, 68) | (14, 6, 5) |
| 6 | 557 751 551 637 523 727 | (1, 4, 9) | (40, 52, 68) | (14, 6, 5) |
| 7 | 515 677 453 755 551 717 | (1, 6, 9) | (38, 40, 50) | (4, 2, 1) |
| 8 | 545 773 557 651 455 747 | (1, 6, 9) | (38, 40, 50) | (4, 2, 1) |
| 9 | 515 677 557 651 551 717 | (1, 6, 12) | (38, 40, 50) | (4, 2, 1) |
| 10 | 545 773 453 755 455 747 | (1, 6, 12) | (38, 40, 50) | (4, 2, 1) |
| 11 | 515 677 557 651 455 747 | (1, 6, 12) | (38, 40, 50) | (4, 8, 1) |
| 12 | 545 773 453 755 551 717 | (1, 6, 12) | (38, 40, 50) | (4, 8, 1) |
| 13 | 457 755 465 753 551 637 | (1, 6, 12) | (40, 52, 52) | (6, 8, 5) |
| 14 | 457 755 531 657 551 637 | (1, 6, 12) | (40, 52, 52) | (6, 8, 5) |
| 15 | 557 751 455 763 465 753 | (1, 6, 12) | (40, 52, 52) | (8, 6, 5) |
| 16 | 557 751 455 763 531 657 | (1, 6, 12) | (40, 52, 52) | (8, 6, 5) |
| 17 | 557 751 465 753 551 637 | (1, 6, 12) | (40, 52, 52) | (6, 14, 5) |
| 18 | 557 751 531 657 551 637 | (1, 6, 12) | (40, 52, 52) | (6, 14, 5) |
| 19 | 457 755 455 763 465 753 | (1, 6, 12) | (40, 52, 52) | (14, 6, 5) |
| 20 | 457 755 455 763 531 657 | (1, 6, 12) | (40, 52, 52) | (14, 6, 5) |
| 21 | 557 751 455 763 515 567 | (1, 6, 9) | (40, 52, 123) | (8, 6, 1) |
| 22 | 457 755 551 637 545 735 | (1, 6, 9) | (40, 52, 123) | (8, 6, 1) |
| 23 | 457 755 551 637 515 567 | (1, 6, 9) | (40, 52, 123) | (8, 8, 1) |
| 24 | 557 751 455 763 545 735 | (1, 6, 9) | (40, 52, 123) | (8, 8, 1) |
| 25 | 557 751 551 637 545 567 | (1, 6, 9) | (40, 52, 123) | (14, 6, 1) |
| 26 | 457 755 455 763 545 735 | (1, 6, 9) | (40, 52, 123) | (14, 6, 1) |
| 27 | 515 677 551 717 531 657 | (1, 8, 6) | (38, 50, 52) | (2, 6, 4) |
| 28 | 545 773 455 747 465 753 | (1, 8, 6) | (38, 50, 52) | (2, 6, 4) |
| 29 | 515 677 455 747 531 657 | (1, 8, 6) | (38, 50, 52) | (8, 6, 4) |
| 30 | 545 773 551 717 465 753 | (1, 8, 6) | (38, 50, 52) | (8, 6, 4) |
| 31 | 453 755 557 751 455 747 | (1, 10, 15) | (40, 40, 50) | (4, 1, 6) |
| 32 | 457 755 557 651 551 717 | (1, 10, 15) | (40, 40, 50) | (4, 6, 1) |
| 33 | 453 755 557 751 551 717 | (1, 10, 15) | (40, 40, 50) | (4, 1, 12) |
| 34 | 457 755 557 651 455 747 | (1, 10, 15) | (40, 40, 50) | (4, 11, 1) |
| 35 | 453 755 457 755 551 717 | (1, 10, 15) | (40, 40, 50) | (14, 1, 6) |
| 36 | 557 651 557 751 455 747 | (1, 10, 15) | (40, 40, 50) | (14, 1, 6) |
| 37 | 457 755 551 637 557 625 | (1, 10, 9) | (40, 52, 68) | (8, 2, 11) |
| 38 | 557 751 455 763 523 755 | (1, 10, 9) | (40, 52, 68) | (8, 2, 11) |
| 39 | 457 755 455 763 523 727 | (1, 10, 9) | (40, 52, 68) | (14, 2, 5) |
| 40 | 457 755 455 763 557 625 | (1, 10, 9) | (40, 52, 68) | (14, 2, 5) |
| 41 | 557 751 551 637 523 755 | (1, 10, 9) | (40, 52, 68) | (14, 2, 5) |
| 42 | 557 751 551 637 625 727 | (1, 10, 9) | (40, 52, 68) | (14, 2, 5) |
| 43 | 457 755 551 637 523 755 | (1, 10, 9) | (40, 52, 68) | (8, 14, 5) |
| 44 | 557 751 455 763 557 625 | (1, 10, 9) | (40, 52, 68) | (8, 14, 5) |
| 45 | 545 773 455 763 515 567 | (1, 10, 6) | (38, 52, 123) | (8, 6, 1) |
| 46 | 545 773 551 637 515 567 | (1, 10, 6) | (38, 52, 123) | (8, 6, 1) |
| 47 | 515 677 455 763 545 735 | (1, 10, 6) | (38, 52, 123) | (8, 6, 1) |
| 48 | 515 677 551 637 545 735 | (1, 10, 6) | (38, 52, 123) | (8, 6, 1) |
| 49 | 515 677 551 637 515 567 | (1, 10, 6) | (38, 52, 123) | (8, 18, 1) |
| 50 | 545 773 455 763 545 735 | (1, 10, 6) | (38, 52, 123) | (8, 18, 1) |
| 51 | 545 773 557 651 551 717 | (1, 12, 9) | (38, 40, 50) | (4, 8, 1) |
| 52 | 515 677 453 755 455 747 | (1, 12, 9) | (38, 40, 50) | (4, 8, 1) |
| 53 | 457 755 455 763 515 567 | (1, 12, 9) | (40, 52, 123) | (14, 8, 1) |
| 54 | 557 751 551 637 545 735 | (1, 12, 9) | (40, 52, 123) | (14, 8, 1) |
| 55 | 515 677 455 763 515 567 | (1, 16, 6) | (38, 52, 123) | (8, 18, 1) |
| 56 | 545 773 551 637 545 735 | (1, 16, 6) | (38, 52, 123) | (8, 18, 1) |
| 57 | 453 755 457 755 455 747 | (1, 20, 15) | (40, 40, 50) | (14, 1, 2) |
| 58 | 557 651 557 751 551 717 | (1, 20, 15) | (40, 40, 50) | (14, 1, 2) |

The worst performance of the R=1/2 constituent codes using 5 R=1/6 convolutional are as follows, with reference to Table 3.

<Case 1> the worst performance of a R=1/6 convolutional code (NO=1) having generator polynomials of (457, 755, 551, 637, 523, 727)$_8$→(523, 727)$_8$, $c_{12}$=68

<Case 2> the worst performance of a R=1/6 convolutional code (NO=7) having generator polynomials of (515, 677, 453, 755, 551, 717)$_8$→(515, 677)$_8$, $c_{12}$=38

<Case 3> the worst performance of a R=1/6 convolutional code (NO=8) having generator polynomials of (545, 773, 557, 651, 455, 747)$_8$→(545, 773)$_8$, $c_{12}$=38

<Case 4> the worst performance of a R=1/6 convolutional code (NO=11) having generator polynomials of (551, 677, 557, 651, 455, 747)$_8$→(551, 677)$_8$, $c_{12}$=38

<Case 5> the worst performance of a R=1/6 convolutional code (NO=29) having generator polynomials of (515, 677, 455, 747, 531, 657)$_8$→(515, 677)$_8$, $c_{12}$=38

The worst performances for the R=1/4 constituent codes are as follows using the R=1/6 convolutional codes whose performances are verified for the R=1/2 constituent codes.

<Case 1> the worst performance of a R=1/6 convolutional code (NO=1) having generator polynomials of (457, 755, 551, 637, 523, 727)$_8$→(551, 637, 523, 727)$_8$, $c_{24}$=5

<Case 2> the worst performance of a R=1/6 convolutional code (NO=7) having generator polynomials of $(515, 677, 453, 755, 551, 717)_8 \rightarrow (515, 677, 551, 717)_8$, $c_{24}=2$ <Case 3> the worst performance of a R=1/6 convolutional code (NO=8) having generator polynomials of $(545, 773, 557, 651, 455, 747)_8 \rightarrow (545, 773, 455, 747)_8$, $c_{24}=2$ <Case 4> the worst performance of a R=1/6 convolutional code (NO=11) having generator polynomials of $(551, 677, 557, 651, 455, 747)_8 \rightarrow (551, 677, 557, 651)_8$, $c_{24}=4$ <Case 5> the worst performance of a R=1/6 convolutional code (NO=29) having generator polynomials of $(515, 677, 455, 747, 531, 657)_8 \rightarrow (515, 677, 531, 657)_8$, $c_{24}=6$ FIG. 13 illustrates a comparison among the worst performances of R=1/2 constituent codes using R=1/6 convolutional code with the highest performance.

The following are two R=1/6 convolutional codes with a good decoding performance which were selected among the R=1/6 convolutional codes whose performances are verified for various cases in the above examples.

1) $(515, 677, 453, 755, 551, 717)_8$: $c_{38}=6$ (NO=7)

2) $(545, 773, 557, 651, 455, 747)_8$: $c_{38}=6$ (NO=8)

Further, to search for a symbol deleting pattern used for the three-carrier system, various symbol deleting matrixes are considered for the situation where one carrier is damaged. i.e., where the R=1/6 convolutional codes change to R=1/4 convolutional codes. The reason for searching for the symbol deleting matrix pattern is the same as described for the R=1/3 convolutional codes. The following matrixes can be used as a symbol deleting matrix pattern for a method of distributing symbols for R=1/6 convolutional codes.

$$D_1 = \begin{bmatrix} 0 & 1 & 1 \\ 0 & 1 & 1 \\ 1 & 0 & 1 \\ 1 & 0 & 1 \\ 1 & 1 & 0 \\ 1 & 1 & 0 \end{bmatrix} \quad D_2 = \begin{bmatrix} 1 & 1 & 0 \\ 1 & 1 & 0 \\ 1 & 0 & 1 \\ 1 & 0 & 1 \\ 0 & 1 & 1 \\ 0 & 1 & 1 \end{bmatrix}$$

$$D_3 = \begin{bmatrix} 0 & 1 & 1 \\ 1 & 0 & 1 \\ 1 & 1 & 0 \\ 0 & 1 & 1 \\ 1 & 0 & 1 \\ 1 & 1 & 0 \end{bmatrix} \quad D_4 = \begin{bmatrix} 1 & 1 & 0 \\ 1 & 0 & 1 \\ 0 & 1 & 1 \\ 1 & 1 & 0 \\ 1 & 0 & 1 \\ 0 & 1 & 1 \end{bmatrix}$$

$$D_5 = \begin{bmatrix} 0 & 1 & 1 & 1 & 0 & 1 \\ 1 & 0 & 1 & 1 & 1 & 0 \\ 0 & 1 & 0 & 1 & 1 & 1 \\ 1 & 0 & 1 & 0 & 1 & 1 \\ 1 & 1 & 0 & 1 & 0 & 1 \\ 1 & 1 & 1 & 0 & 1 & 0 \end{bmatrix}$$

$$D_6 = \begin{bmatrix} 1 & 1 & 1 & 0 & 1 & 0 \\ 1 & 1 & 0 & 1 & 0 & 1 \\ 1 & 0 & 1 & 0 & 1 & 1 \\ 0 & 1 & 0 & 1 & 1 & 1 \\ 1 & 0 & 1 & 1 & 1 & 0 \\ 0 & 1 & 1 & 1 & 0 & 1 \end{bmatrix}$$

$$D_7 = \begin{bmatrix} 0 & 1 & 1 \\ 1 & 0 & 1 \\ 1 & 1 & 0 \\ 1 & 1 & 0 \\ 1 & 0 & 1 \\ 0 & 1 & 1 \end{bmatrix} \quad D_8 = \begin{bmatrix} 1 & 1 & 0 \\ 1 & 0 & 1 \\ 0 & 1 & 1 \\ 0 & 1 & 1 \\ 1 & 0 & 1 \\ 1 & 1 & 0 \end{bmatrix}$$

$$D_9 = \begin{bmatrix} 0 & 1 & 1 & 1 & 1 & 0 \\ 1 & 0 & 1 & 1 & 0 & 1 \\ 1 & 1 & 0 & 0 & 1 & 1 \\ 0 & 1 & 1 & 1 & 1 & 0 \\ 1 & 0 & 1 & 1 & 0 & 1 \\ 1 & 1 & 0 & 0 & 1 & 1 \end{bmatrix}$$

$$D_{10} = \begin{bmatrix} 1 & 1 & 0 & 0 & 1 & 1 \\ 1 & 0 & 1 & 1 & 0 & 1 \\ 0 & 1 & 1 & 1 & 1 & 0 \\ 1 & 1 & 0 & 0 & 1 & 1 \\ 1 & 0 & 1 & 1 & 0 & 1 \\ 0 & 1 & 1 & 1 & 1 & 0 \end{bmatrix}$$

$$D_{11} = \begin{bmatrix} 0 & 1 & 1 & 1 & 1 & 0 \\ 1 & 0 & 1 & 1 & 0 & 1 \\ 1 & 1 & 0 & 0 & 1 & 1 \\ 1 & 1 & 0 & 0 & 1 & 1 \\ 1 & 0 & 1 & 1 & 0 & 1 \\ 0 & 1 & 1 & 1 & 1 & 0 \end{bmatrix}$$

$$D_{12} = \begin{bmatrix} 1 & 1 & 0 & 0 & 1 & 1 \\ 1 & 0 & 1 & 1 & 0 & 1 \\ 0 & 1 & 1 & 1 & 1 & 0 \\ 0 & 1 & 1 & 1 & 1 & 0 \\ 1 & 0 & 1 & 1 & 0 & 1 \\ 1 & 1 & 0 & 0 & 1 & 1 \end{bmatrix}$$

Taking into consideration the case where two carriers are damaged in the three-carrier system, the following symbol deleting matrix patterns can be used in a method of distributing symbols for R=1/2 symbol-deleted convolutional codes using generator polynomials for the R=1/6 convolutional codes with a good decoding performance.

$$D_{2\text{-}1} = \begin{bmatrix} 1 & 0 & 0 \\ 1 & 0 & 0 \\ 0 & 1 & 0 \\ 0 & 1 & 0 \\ 0 & 0 & 1 \\ 0 & 0 & 1 \end{bmatrix} \quad D_{2\text{-}2} = \begin{bmatrix} 0 & 0 & 1 \\ 0 & 0 & 1 \\ 0 & 1 & 0 \\ 0 & 1 & 0 \\ 1 & 0 & 0 \\ 1 & 0 & 0 \end{bmatrix}$$

$$D_{2-3} = \begin{bmatrix} 1 & 0 & 0 \\ 0 & 1 & 0 \\ 0 & 0 & 1 \\ 1 & 0 & 0 \\ 0 & 1 & 0 \\ 0 & 0 & 1 \end{bmatrix} \quad D_{2-4} = \begin{bmatrix} 0 & 0 & 1 \\ 0 & 1 & 0 \\ 1 & 0 & 0 \\ 0 & 0 & 1 \\ 0 & 1 & 0 \\ 1 & 0 & 0 \end{bmatrix}$$

$$D_{2-5} = \begin{bmatrix} 1 & 0 & 0 & 0 & 1 & 0 \\ 0 & 1 & 0 & 0 & 0 & 1 \\ 1 & 0 & 1 & 0 & 0 & 0 \\ 0 & 1 & 0 & 1 & 0 & 0 \\ 0 & 0 & 1 & 0 & 1 & 0 \\ 0 & 0 & 0 & 1 & 0 & 1 \end{bmatrix}$$

$$D_{2-6} = \begin{bmatrix} 0 & 0 & 0 & 1 & 0 & 1 \\ 0 & 0 & 1 & 0 & 1 & 0 \\ 0 & 1 & 0 & 1 & 0 & 0 \\ 1 & 0 & 1 & 0 & 0 & 0 \\ 0 & 1 & 0 & 0 & 0 & 1 \\ 1 & 0 & 0 & 0 & 1 & 0 \end{bmatrix}$$

$$D_{2-7} = \begin{bmatrix} 1 & 0 & 0 \\ 0 & 1 & 0 \\ 0 & 0 & 1 \\ 0 & 0 & 1 \\ 0 & 1 & 0 \\ 1 & 0 & 0 \end{bmatrix} \quad D_{2-8} = \begin{bmatrix} 0 & 0 & 1 \\ 0 & 1 & 0 \\ 1 & 0 & 0 \\ 1 & 0 & 0 \\ 0 & 1 & 0 \\ 0 & 0 & 1 \end{bmatrix}$$

$$D_{2-9} = \begin{bmatrix} 1 & 0 & 0 & 0 & 0 & 1 \\ 0 & 1 & 0 & 0 & 1 & 0 \\ 0 & 0 & 1 & 1 & 0 & 0 \\ 1 & 0 & 0 & 0 & 0 & 1 \\ 0 & 1 & 0 & 0 & 1 & 0 \\ 0 & 0 & 1 & 1 & 0 & 0 \end{bmatrix}$$

$$D_{2-10} = \begin{bmatrix} 0 & 0 & 1 & 1 & 0 & 0 \\ 0 & 1 & 0 & 0 & 1 & 0 \\ 1 & 0 & 0 & 0 & 0 & 1 \\ 0 & 0 & 1 & 1 & 0 & 0 \\ 0 & 1 & 0 & 0 & 1 & 0 \\ 1 & 0 & 0 & 0 & 0 & 1 \end{bmatrix}$$

$$D_{2-11} = \begin{bmatrix} 1 & 0 & 0 & 0 & 0 & 1 \\ 0 & 1 & 0 & 0 & 1 & 0 \\ 0 & 0 & 1 & 1 & 0 & 0 \\ 0 & 0 & 1 & 1 & 0 & 0 \\ 0 & 1 & 0 & 0 & 1 & 0 \\ 1 & 0 & 0 & 0 & 0 & 1 \end{bmatrix}$$

$$D_{2-12} = \begin{bmatrix} 0 & 0 & 1 & 1 & 0 & 0 \\ 0 & 1 & 0 & 0 & 1 & 0 \\ 1 & 0 & 0 & 0 & 0 & 1 \\ 1 & 0 & 0 & 0 & 0 & 1 \\ 0 & 1 & 0 & 0 & 1 & 0 \\ 0 & 0 & 1 & 1 & 0 & 0 \end{bmatrix}$$

Turning to FIG. 6, there is shown the convolutional encoder 601 and the symbol distributer 602 according to an embodiment of the present invention. In the exemplary convolutional encoder 601 has a coding rate of R=1/6 and uses generator polynomial or (545, 773, 557, 651, 455, 747). The detailed structure of the R=1/6 convolutional encoder 601 is illustrated in FIG. 7.

Figure 7:
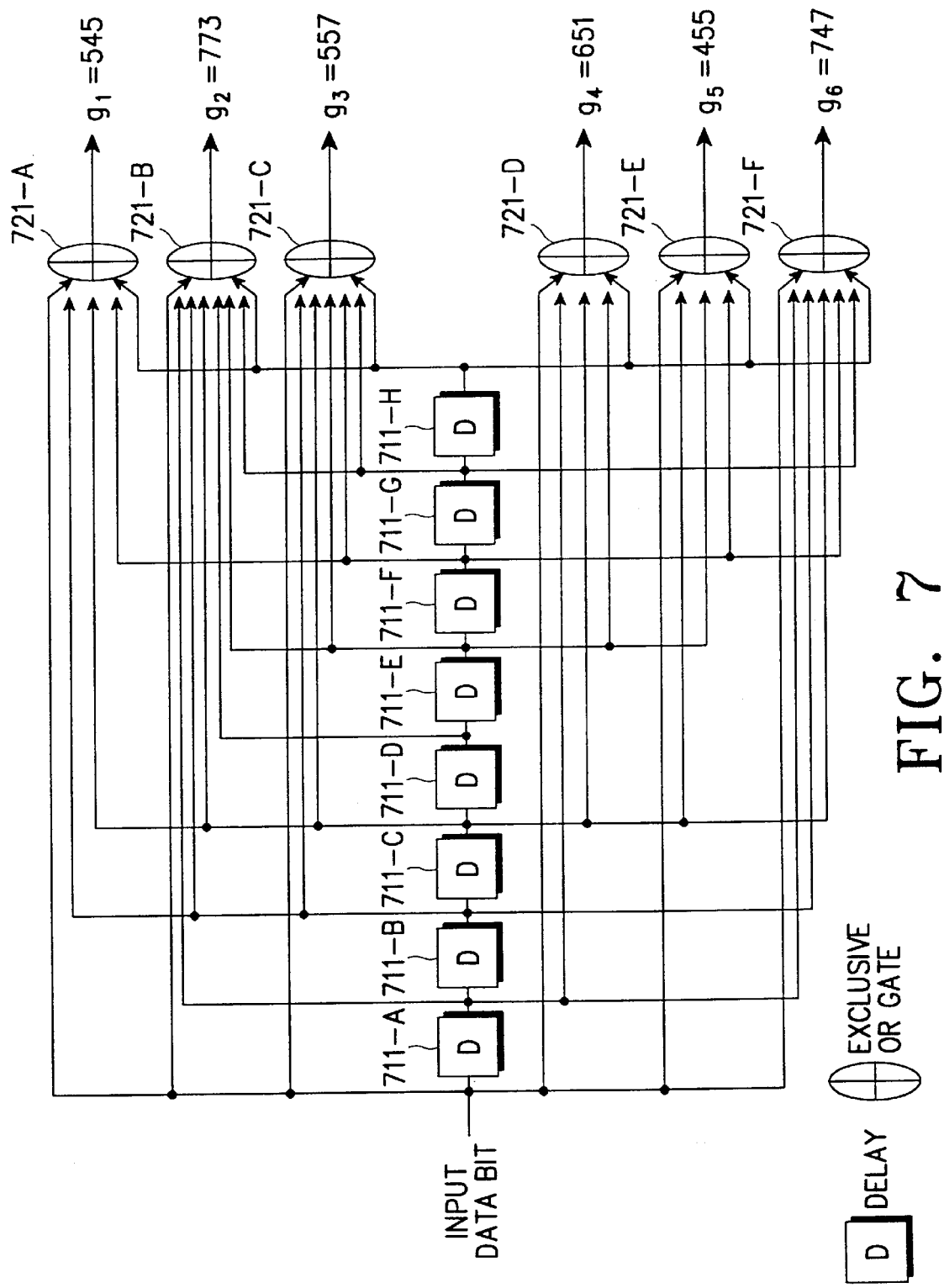
FIG. 7 is a schematic diagram illustrating the R=1/6 convolutional encoder of FIG. 6.

Referring to FIG. 7, upon receipt of input data, delays 711-A to 711-H delay the input data bits sequentially. During the sequential delay of the input data bits, exclusive OR gates 721-A to 721-F output coded symbols. The coded symbols of FIG. 7 are provided to the symbol distributer 602 having the structure as shown by FIG. 8.

Figure 8:
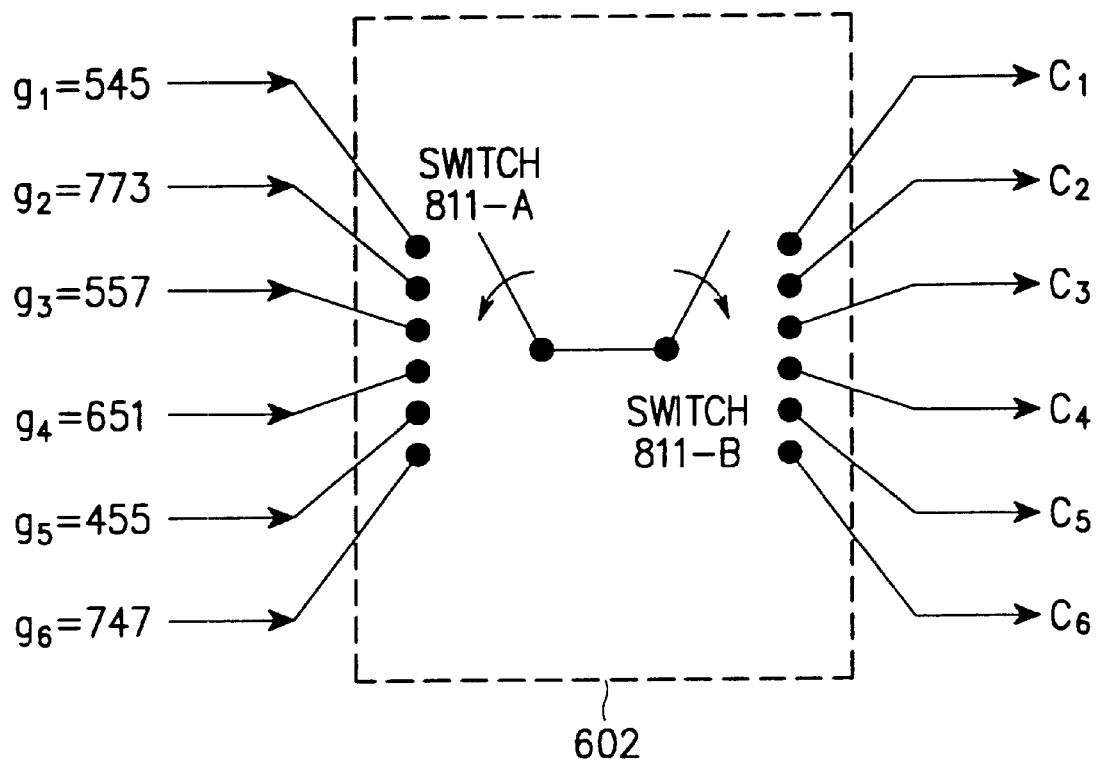
FIG. 8 illustrates the symbol distributer of FIG. 6.

Referring to FIG. 8, the symbol distributer 602 is implemented by switches 811-A and 811-B. In FIG. 8, when a symbol rate of a clock for controlling the switches 811-A and 811-B is over six times a symbol rate of the symbol distributer 602, the symbols can be distributed without symbol loss. That is, the switch 811-A sequentially receives input symbols $g_1, g_2, g_3, g_4, g_5, g_6, g_1, g_2, g_3, \ldots$, and the switch 811-B distributes the input symbols to output nodes $c_1, c_2, c_3, c_4, c_5$ and $c_6$.

Figure 9:
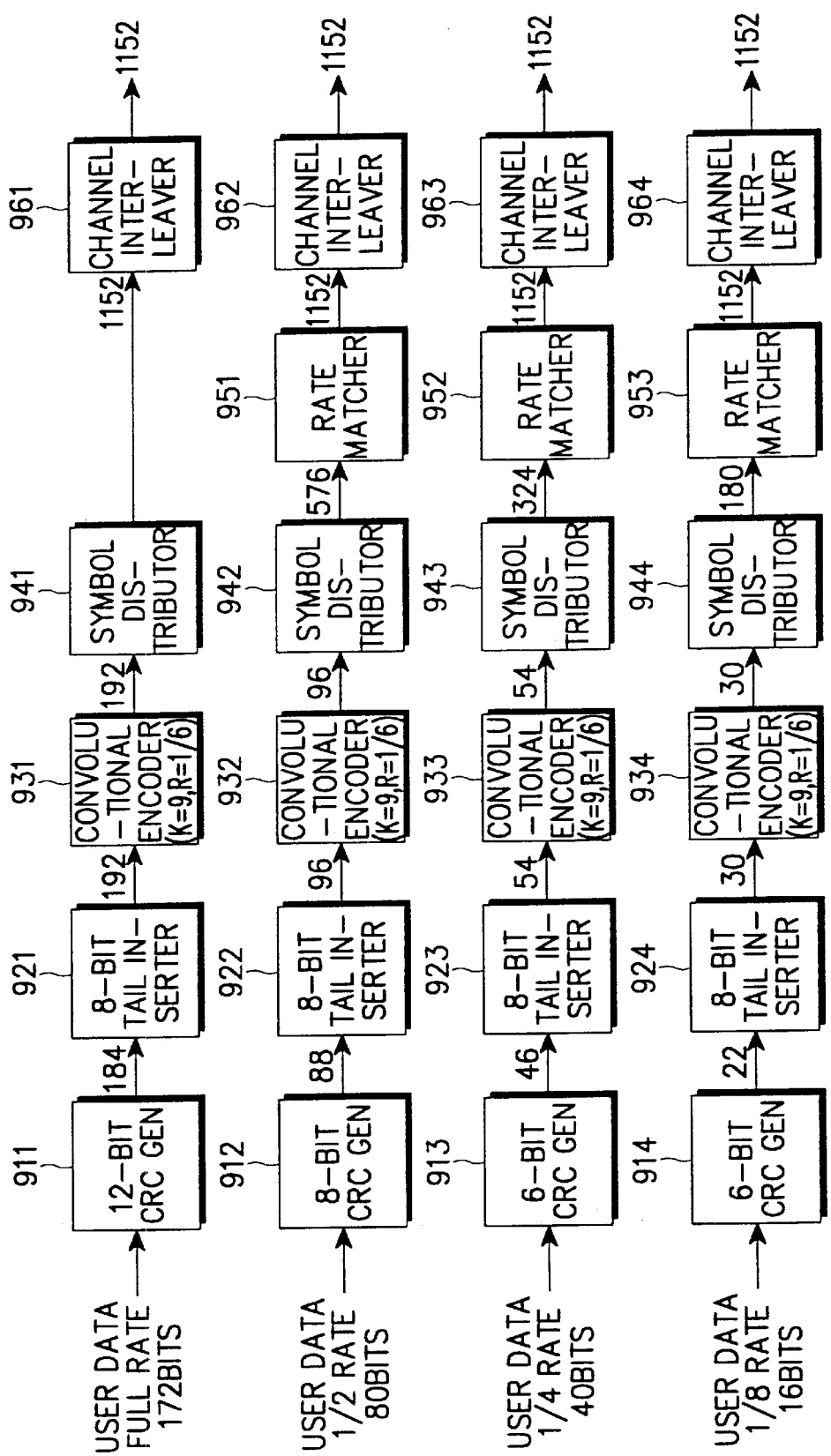
FIG. 9 illustrates block diagrams of a transmission scheme for a forward link using the channel encoder and the symbol distributer according to the present invention.

FIG. 9 illustrates transmission schemes using the channel encoder 601 and the symbol distributer 602 of FIG. 6. First to fourth CRC generators 911–914 add CRC data in a specified number of bits to input data. Specifically, 12-bit CRC is added to the 172-bit data of the first rate; 8-bit CRC is added to the 80-bit data of the second rate; 6-bit CRC is added to the 40-bit data of the third rate; and 6-bit CRC is added to the 16-bit data of the fourth rate. First to fourth tail bit generators 921–924 add 8 tail bits to the CRC-added data. Therefore, the first tail bit generator 921 outputs 192 bits; the second tail bit generator 922 outputs 96 bits; the third tail bit generator 923 outputs 54 bits; and the fourth tail bit generator 924 outputs 30 bits.

First to fourth encoders 931–934 encode data output from the first to fourth tail bit generators 921–924, respectively. Here, a K=9, R=1/6 convolutional encoder can be used for the encoders 931–934. In this case, the first encoder 931 encodes the 192-bit data output from the first tail bit generator 921 into 1152 symbols of fall rate; the second encoder 932 encodes the 96-bit data output from the second tail bit generator 922 into 576 symbols of ½ rate; the third encoder 933 encodes the 54-bit data output from the third tail bit generator 923 into 324 symbols of about ¼ rate; and the fourth encoder 934 encodes the 30-bit data output from the fourth tail bit generator 924 into 180 symbols of about ⅛ rate.

First to fourth symbol distributers 941–944 distribute the symbols output from the encoders 931–934, respectively. Here, for symbol distribution, a channel controller (not shown) generates control signals for distributing the channel-coded bits such that performance degradation is minimized during decoding of received damaged bits, when the coded symbols being transmitted are overlaid on the symbols of a different system at the same frequency band. The symbol distributers 941–944 then assign the symbols outputted from the encoders 931–934 to the corresponding carriers according to the control signals.

Rate matchers 951–953 each include a symbol repeater and a symbol deletion device. The rate matchers 951–953 match rates of the symbols outputted from the corresponding symbol distributers 942–944 to a rate of the symbols outputted from the symbol distributer 941. First to fourth channel interleavers 961–964 interleave the symbols outputted from the symbol distributer 941 and the rate matchers 951–953, respectively. For the DS-CDMA communication system, the symbol distributers 941–944 of FIG. 9 can be removed.

As described above, in the multicarrier system employing the frequency overlay method, the respective carriers have limited transmission powers according to the loading in the frequency bands of the IS-95 system, which results in loss of data received at one or more carrier frequency bands. To solve this problem, by using the generator polynomials for the channel encoder and a symbol distribution method, it is possible to provide a high coding gain against the data loss due to the carrier loss, thereby preventing degradation of the BER.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A channel transmission device for use in a code division multiple access (CDMA) communication system using at least two carriers, comprising:

a channel encoder for encoding channel data to be transmitted as symbols at a predetermined coding rate;

a channel controller for generating a symbol distribution signal according to a predetermined symbol deleting matrix pattern, wherein the symbol deleting matrix pattern is constructed to distribute the symbols to the at least two carriers with a minimum performance degradation; and a symbol distributer for receiving the symbols and distributing said received symbols to the at least two carriers according to the symbol distribution signal.

2. The channel transmission device as claimed in claim 1, wherein the channel encoder is a convolutional encoder with a coding rate of R=1/6.

3. The channel transmission device as claimed in claim 2, wherein the convolutional encoder generates the symbols using one of a plurality of generator polynomials, said generator polynomials being selected from the group included in the following table:

| No | 1/6 Generator Polynomial (Octal Number) | 1/6 BER coeff. $c_{37}, c_{38}, c_{39}$ | 1/2 BER coeff. $c_{12}$ (1,2; 3,4; 5,6) | 1/4 BER coeff. $c_{24}$ (1234; 1256; 3456) |
|---|---|---|---|---|
| 1 | 457 755 551 637 523 727 | −149 | −405268 | −825 |
| 2 | 557 751 455 763 625 727 | −149 | −405268 | −825 |
| 3 | 457 755 551 637 625 727 | −149 | −405268 | −865 |
| 4 | 557 751 455 763 523 727 | −149 | −405268 | −865 |
| 5 | 457 755 455 763 625 727 | −149 | −405268 | −1465 |
| 6 | 557 751 551 637 523 727 | −149 | −405268 | −1465 |
| 7 | 515 677 453 755 551 717 | −169 | −384050 | −421 |
| 8 | 545 773 557 651 455 747 | −169 | −384050 | −421 |
| 9 | 515 677 557 651 551 717 | −1612 | −384050 | −421 |
| 10 | 545 773 453 755 455 747 | −1612 | −384050 | −421 |
| 11 | 515 677 557 651 455 747 | −1612 | −384050 | −481 |
| 12 | 545 773 453 755 551 717 | −1612 | −384050 | −481 |
| 13 | 457 755 465 753 551 637 | −1612 | −405252 | −685 |
| 14 | 457 755 531 657 551 637 | −1612 | −405252 | −685 |
| 15 | 557 751 455 763 465 753 | −1612 | −405252 | −865 |
| 16 | 557 751 455 763 531 657 | −1612 | −405252 | −865 |
| 17 | 557 751 465 753 551 637 | −1612 | −405252 | −6145 |
| 18 | 557 751 531 657 551 637 | −1612 | −405252 | −6145 |
| 19 | 457 755 455 763 465 753 | −1612 | −405252 | −1465 |
| 20 | 457 755 455 763 531 657 | −1612 | −405252 | −1465 |
| 21 | 557 751 455 763 515 567 | −169 | −4052123 | −861 |
| 22 | 457 755 551 637 545 735 | −169 | −4052123 | −861 |
| 23 | 457 755 551 637 515 567 | −169 | −4052123 | −881 |
| 24 | 557 751 455 763 545 735 | −169 | −4052123 | −881 |
| 25 | 557 751 551 637 515 567 | −169 | −4052123 | −1461 |
| 26 | 457 755 455 763 545 735 | −169 | −4052123 | −1461 |
| 27 | 515 677 551 717 531 657 | −186 | −385052 | −264 |
| 28 | 545 773 455 747 465 753 | −186 | −385052 | −264 |
| 29 | 515 677 455 747 531 657 | −186 | −385052 | −864 |
| 30 | 545 773 551 717 465 753 | −186 | −385052 | −864 |
| 31 | 453 755 557 751 455 747 | −11015 | −404050 | −416 |
| 32 | 457 755 557 651 551 717 | −11015 | −404050 | −461 |
| 33 | 453 755 557 751 551 717 | −11015 | −404050 | −4112 |
| 34 | 457 755 557 651 455 747 | −11015 | −404050 | −4111 |
| 35 | 453 755 457 755 551 717 | −11015 | −404050 | −1416 |
| 36 | 557 651 557 751 455 747 | −11015 | −404050 | −1416 |
| 37 | 457 755 551 637 557 625 | −1109 | −405268 | −8211 |
| 38 | 557 751 455 763 523 755 | −1109 | −405268 | −8211 |
| 39 | 457 755 455 763 523 727 | −1109 | −405268 | −1425 |
| 40 | 457 755 455 763 557 625 | −1109 | −405268 | −1425 |
| 41 | 557 751 551 637 523 755 | −1109 | −405268 | −1425 |
| 42 | 557 751 551 637 625 727 | −1109 | −405268 | −1425 |
| 43 | 457 755 551 637 523 755 | −1109 | −405268 | −8145 |
| 44 | 557 751 455 763 557 625 | −1109 | −405268 | −8145 |
| 45 | 545 773 455 763 515 567 | −1106 | −3852123 | −861 |
| 46 | 545 773 551 637 515 567 | −1106 | −3852123 | −861 |
| 47 | 515 677 455 763 545 735 | −1106 | −3852123 | −861 |
| 48 | 515 677 551 637 545 735 | −1106 | −3852123 | −861 |
| 49 | 515 677 551 637 515 567 | −1106 | −3852123 | −8181 |
| 50 | 545 773 455 763 545 735 | −1106 | −3852123 | −8181 |

-continued

| No | 1/6 Generator Polynomial (Octal Number) | 1/6 BER coeff. $c_{37}, c_{38}, c_{39}$ | 1/2 BER coeff. $c_{12}$ (1,2; 3,4; 5,6) | 1/4 BER coeff. $c_{24}$ (1234; 1256; 3456) |
|---|---|---|---|---|
| 51 | 545 773 557 651 551 717 | −1129 | −384050 | −481 |
| 52 | 515 677 453 755 455 747 | −1129 | −384050 | −481 |
| 53 | 457 755 455 763 515 567 | −1129 | −4052123 | −1481 |
| 54 | 557 751 551 637 545 735 | −1129 | −4052123 | −1481 |
| 55 | 515 677 455 763 515 567 | −1166 | −3852123 | −8181 |
| 56 | 545 773 551 637 545 735 | −1166 | −3852123 | −8181 |
| 57 | 453 755 457 755 455 747 | −12015 | −404050 | −1412 |
| 58 | 557 651 557 751 551 717 | −12015 | −404050 | −1412 |

4. The channel transmission device as claimed in claim 1, wherein the symbol distributer comprises:
a first selector for sequentially multiplexing the received symbols; and
a second selector for distributing the multiplexed symbols to the at least two carriers according to the symbol distribution signal.

5. A channel transmission device for use in a multicarrier code division multiple access (CDMA) communication system using at least two carriers, comprising:
a channel encoder for encoding channel data to be transmitted as symbols at a predetermined coding rate;
a symbol distributer for receiving the symbols and distributing received symbols to the at least two carriers according to a predetermined symbol deleting matrix pattern, wherein the symbol deleting matrix pattern is constructed to distribute the symbols to the at least two carriers with minimum degradation;
a channel interleaver for channel interleaving the distributed symbols;
a demultiplexer for distributing the interleaved symbols to the carriers;
a plurality of orthogonal modulators for generating orthogonally modulated signals by multiplying the distributed interleaved symbols by orthogonal codes for the corresponding channels;
a plurality of spreaders for receiving the orthogonally modulated signals and generating spread signals by multiplying the received orthogonally modulated signals by a spreading code; and
a plurality of transmitters for receiving the spread signals and transmitting the received spread signals using the at least two carriers.

6. The channel transmission device as claimed in claim 5, wherein the channel encoder is a convolutional encoder with a coding rate of R=1/6.

7. The channel transmission device as claimed in claim 6, wherein the convolutional encoder generates the symbols using one of a plurality of generator polynomials, said generator polynomials being selected from the group included in the following table:

| No | 1/6 Generator Polynomial (Octal Number) | 1/6 BER coeff. $c_{37}, c_{38}, c_{39}$ | 1/2 BER coeff. $c_{12}$ (1,2; 3,4; 5,6) | 1/4 BER coeff. $c_{24}$ (1234; 1256; 3456) |
|---|---|---|---|---|
| 1 | 457 755 551 637 523 727 | −149 | −405268 | −825 |
| 2 | 557 751 455 763 625 727 | −149 | −405268 | −825 |
| 3 | 457 755 551 637 625 727 | −149 | −405268 | −865 |
| 4 | 557 751 455 763 523 727 | −149 | −405268 | −865 |
| 5 | 457 755 455 763 625 727 | −149 | −405268 | −1465 |
| 6 | 557 751 551 637 523 727 | −149 | −405268 | −1465 |
| 7 | 515 677 453 755 551 717 | −169 | −384050 | −421 |
| 8 | 545 773 557 651 455 747 | −169 | −384050 | −421 |
| 9 | 515 677 557 651 551 717 | −1612 | −384050 | −421 |
| 10 | 545 773 453 755 455 747 | −1612 | −384050 | −421 |
| 11 | 515 677 557 651 455 747 | −1612 | −384050 | −481 |
| 12 | 545 773 453 755 551 717 | −1612 | −384050 | −481 |
| 13 | 457 755 465 753 551 637 | −1612 | −405252 | −685 |
| 14 | 457 755 531 657 551 637 | −1612 | −405252 | −685 |
| 15 | 557 751 455 763 465 753 | −1612 | −405252 | −865 |
| 16 | 557 751 455 763 531 657 | −1612 | −405252 | −865 |
| 17 | 557 751 465 753 551 637 | −1612 | −405252 | −6145 |
| 18 | 557 751 531 657 551 637 | −1612 | −405252 | −6145 |
| 19 | 457 755 455 763 465 753 | −1612 | −405252 | −1465 |
| 20 | 457 755 455 763 531 657 | −1612 | −405252 | −1465 |
| 21 | 557 751 455 763 515 567 | −169 | −4052123 | −861 |
| 22 | 457 755 551 637 545 735 | −169 | −4052123 | −861 |
| 23 | 457 755 551 637 515 567 | −169 | −4052123 | −881 |
| 24 | 557 751 455 763 545 735 | −169 | −4052123 | −881 |
| 25 | 557 751 551 637 515 567 | −169 | −4052123 | −1461 |
| 26 | 457 755 455 763 545 735 | −169 | −4052123 | −1461 |
| 27 | 515 677 551 717 531 657 | −186 | −385052 | −264 |
| 28 | 545 773 455 747 465 753 | −186 | −385052 | −264 |
| 29 | 515 677 455 747 531 657 | −186 | −385052 | −864 |
| 30 | 545 773 551 717 465 753 | −186 | −385052 | −864 |
| 31 | 453 755 557 751 455 747 | −11015 | −404050 | −416 |

-continued

| No | 1/6 Generator Polynomial (Octal Number) | 1/6 BER coeff. $c_{37}, c_{38}, c_{39}$ | 1/2 BER coeff. $c_{12}$ (1,2; 3,4; 5,6) | 1/4 BER coeff. $c_{24}$ (1234; 1256; 3456) |
|---|---|---|---|---|
| 32 | 457 755 557 651 551 717 | −11015 | −404050 | −461 |
| 33 | 453 755 557 751 551 717 | −11015 | −404050 | −4112 |
| 34 | 457 755 557 651 455 747 | −11015 | −404050 | −4111 |
| 35 | 453 755 457 755 551 717 | −11015 | −404050 | −1416 |
| 36 | 557 651 557 751 455 747 | −11015 | −404050 | −1416 |
| 37 | 457 755 551 637 557 625 | −1109 | −405268 | −8211 |
| 38 | 557 751 455 763 523 755 | −1109 | −405268 | −8211 |
| 39 | 457 755 455 763 523 727 | −1109 | −405268 | −1425 |
| 40 | 457 755 455 763 557 625 | −1109 | −405268 | −1425 |
| 41 | 557 751 551 637 523 755 | −1109 | −405268 | −1425 |
| 42 | 557 751 551 637 625 727 | −1109 | −405268 | −1425 |
| 43 | 457 755 551 637 523 755 | −1109 | −405268 | −8145 |
| 44 | 557 751 455 763 557 625 | −1109 | −405268 | −8145 |
| 45 | 545 773 455 763 515 567 | −1106 | −3852123 | −861 |
| 46 | 545 773 551 637 515 567 | −1106 | −3852123 | −861 |
| 47 | 515 677 455 763 545 735 | −1106 | −3852123 | −861 |
| 48 | 515 677 551 637 545 735 | −1106 | −3852123 | −861 |
| 49 | 515 677 551 637 515 567 | −1106 | −3852123 | −8181 |
| 50 | 545 773 455 763 545 735 | −1106 | −3852123 | −8181 |
| 51 | 545 773 557 651 551 717 | −1129 | −384050 | −481 |
| 52 | 515 677 453 755 455 747 | −1129 | −384050 | −481 |
| 53 | 457 755 455 763 515 567 | −1129 | −4052123 | −1481 |
| 54 | 557 751 551 637 545 735 | −1129 | −4052123 | −1481 |
| 55 | 515 677 455 763 515 567 | −1166 | −3852123 | −8181 |
| 56 | 545 773 551 637 545 735 | −1166 | −3852123 | −8181 |
| 57 | 453 755 457 755 455 747 | −12015 | −404050 | −1412 |
| 58 | 557 651 557 751 551 717 | −12015 | −404050 | −1412 |

8. The channel transmission device as claimed in claim 5, wherein the symbol distributer comprises:
   a first selector for sequentially multiplexing the received symbols; and
   a second selector for distributing the multiplexed symbols to the at least two carriers according to the symbol distribution signal.

9. A channel transmission method for use in a CDMA communication system using at least two carriers, comprising the steps of:
   encoding channel data to be transmitted into symbols at a predetermined coding rate; and
   distributing the symbols to the at least two carriers according to a predetermined symbol deleting matrix pattern, wherein the symbol deleting matrix pattern is constructed to distribute the symbols to the at least two carriers with minimum performance degradation.

10. The channel transmission method as claimed in claim 9, wherein the channel encoder is a convolutional encoder with a coding rate of R=1/6.

11. The channel transmission method as claimed in claim 9, the step of distributing the symbols further comprises the steps of:
   sequentially multiplexing the received symbols; and
   distributing the multiplexed symbols to the at least two carriers according to the symbol distribution signal.

12. A channel encoding device for use in a code division multiple access (CDMA) system comprising:
   a plurality of delays for delaying an input data bit to generate first to eight delayed data bits;
   a first operator for exclusively ORing the input data bit and the third, fifth, sixth, seventh and eighth delayed data bits to generate a first symbol;
   a second operator for exclusively ORing the input data bit and the first, second, third, fifth, sixth and eighth delayed data bits to generate a second symbol;
   a third operator for exclusively ORing the input data bit and the second, third, fifth and eighth delayed data bits to generate a third symbol;
   a fourth operator for exclusively ORing the input data bit and the first, fourth, fifth, sixth, seventh and eighth delayed data bits to generate a fourth symbol;
   a fifth operator for exclusively ORing the input data bit and the first, fourth, sixth and eighth delayed data bits to generate a fifth symbol; and
   a sixth operator for exclusively ORing the input data bit and the first, second, fourth, sixth, seventh and eighth delayed data bits to generate a sixth symbol.

13. A channel transmission device for use in a code division multiple access (CDMA) communication system, comprising:
   a channel encoder including,
      a plurality of delays for delaying an input data bit to generate first to eight delayed data bits;
      a first operator for exclusively ORing the input data bit and the third, fifth, sixth, seventh and eighth delayed data bits to generate a first symbol;
      a second operator for exclusively ORing the input data bit and the first, second, third, fifth, sixth and eighth delayed data bits to generate a second symbol;
      a third operator for exclusively ORing the input data bit and the second, third, fifth and eighth delayed data bits to generate a third symbol;
      a fourth operator for exclusively ORing the input data bit and the first, fourth, fifth, sixth, seventh and eighth delayed data bits to generate a fourth symbol;
      a fifth operator for exclusively ORing the input data bit and the first, fourth, sixth and eighth delayed data bits to generate a fifth symbol;
      a sixth operator for exclusively ORing the input data bit and the first, second, fourth, sixth, seventh and eighth delayed data bits to generate a sixth symbol;
   a channel interleaver for receiving the symbols and channel interleaving the received symbols;
   an orthogonal modulator for generating an orthogonally modulated signal by multiplying the distributed symbols by an orthogonal code for the channel; and a spreader for generating a spread signal by multiplying the orthogonally modulated signal by a spreading code.

14. The channel transmission device as claimed in claim 13, wherein the symbol distributer distributes the symbols output from the channel encoder according to a symbol deleting matrix pattern, wherein the symbol deleting matrix pattern is so determined as to distribute the symbols to the respective carriers with a minimized performance degradation even though a specific carrier is damaged.

15. A channel encoding method for use in a CDMA communication system, comprising the steps of:

delaying a received input data bit to generate first to eight delayed data bits;

exclusively ORing the received input data bit and the third, fifth, sixth, seventh and eighth delayed data bits to generate a first symbol;

exclusively ORing the received input data bit and the first, second, third, fifth, sixth and eighth delayed data bits to generate a second symbol;

exclusively ORing the received input data bit and the second, third, fifth and eighth delayed data bits to generate a third symbol;

exclusively ORing the received input data bit and the first, fourth, fifth, sixth, seventh and eighth delayed data bits to generate a fourth symbol;

exclusively ORing the received input data bit and the first, fourth, sixth and eighth delayed data bits to generate a fifth symbol; and exclusively ORing the received input data bit and the first, second, fourth, sixth, seventh and eighth delayed data bits to generate a sixth symbol.

* * * * *